(12) United States Patent
Sun et al.

(10) Patent No.: US 12,381,556 B2
(45) Date of Patent: Aug. 5, 2025

(54) KICKBACK REDUCTION IN BOOTSTRAPPED SWITCHES

(71) Applicant: QUALCOMM Incorporated, San Diego, CA (US)

(72) Inventors: Lei Sun, San Diego, CA (US); Elias Dagher, Laguna Niguel, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 193 days.

(21) Appl. No.: 18/181,026

(22) Filed: Mar. 9, 2023

(65) Prior Publication Data

US 2024/0305296 A1    Sep. 12, 2024

(51) Int. Cl.
*H03K 19/003* (2006.01)
*H03K 17/06* (2006.01)
*H03K 17/687* (2006.01)
*H03K 19/017* (2006.01)

(52) U.S. Cl.
CPC ..... *H03K 19/00361* (2013.01); *H03K 17/063* (2013.01); *H03K 17/6871* (2013.01); *H03K 19/01735* (2013.01)

(58) Field of Classification Search
None
See application file for complete search history.

(56) References Cited

U.S. PATENT DOCUMENTS

| 9,147,497 | B1* | 9/2015 | Oo ........................ H03K 17/063 |
| 9,419,639 | B1 | 8/2016 | Hu et al. |
| 2005/0258874 | A1 | 11/2005 | Kudo |
| 2006/0202735 | A1 | 9/2006 | Aksin et al. |
| 2010/0253394 | A1 | 10/2010 | Tran |
| 2011/0018589 | A1 | 1/2011 | Lee et al. |
| 2012/0262316 | A1 | 10/2012 | Strode |
| 2014/0266392 | A1 | 9/2014 | Devarajan et al. |
| 2015/0109161 | A1 | 4/2015 | Trampitsch |
| 2015/0311895 | A1 | 10/2015 | Ali |

(Continued)

FOREIGN PATENT DOCUMENTS

| CN | 100568689 C | 12/2009 |
| CN | 113872602 A | 12/2021 |

(Continued)

OTHER PUBLICATIONS

International Search Report and Written Opinion—PCT/US2024/011750—ISA/EPO—Apr. 26, 2024.

(Continued)

*Primary Examiner* — Jany Richardson
(74) *Attorney, Agent, or Firm* — Loza & Loza LLP

(57) ABSTRACT

A system includes a switch transistor, and a bootstrap circuit having an input and an output, wherein the output of the bootstrap circuit is coupled to a gate of the switch transistor. The system also includes a first buffer having an input and an output, wherein the output of the first buffer is coupled to a terminal of the switch transistor. The system further includes a second buffer having an input and an output, wherein the input of the second buffer is coupled to the input of the first buffer, and the output of the second buffer is coupled to the input of the bootstrap circuit.

29 Claims, 17 Drawing Sheets

(56) References Cited

U.S. PATENT DOCUMENTS

| | | |
|---|---|---|
| 2016/0027528 A1 | 1/2016 | Verbruggen et al. |
| 2018/0076808 A1 | 3/2018 | Singer |
| 2019/0214983 A1 | 7/2019 | Luo |
| 2019/0296756 A1 | 9/2019 | Ali |
| 2019/0305791 A1 | 10/2019 | Ali et al. |
| 2019/0363725 A1 | 11/2019 | Tsai |
| 2020/0212904 A1 | 7/2020 | Sun et al. |
| 2021/0281269 A1 | 9/2021 | Li et al. |
| 2021/0409015 A1 | 12/2021 | Cascio et al. |

FOREIGN PATENT DOCUMENTS

| | | |
|---|---|---|
| CN | 114374388 A | 4/2022 |
| JP | 2006033794 A | 2/2006 |
| TW | 201812861 A | 4/2018 |
| WO | 2020139460 A1 | 7/2020 |

OTHER PUBLICATIONS

Abo A.M., et al., "A 1.5-V, 10-bit, 14.3-MS/s CMOS Pipeline Analog-to-Digital Converter," IEEE Journal of Solid-State Circuits, vol. 34, No. 5, May 1999, pp. 599-606.

\* cited by examiner

# KICKBACK REDUCTION IN BOOTSTRAPPED SWITCHES

BACKGROUND

Field

Aspects of the present disclosure relate generally to switches, and, more particularly, to bootstrapped switches.

Background

A transistor may be used as a switch for selectively blocking or passing a signal on a signal path. A challenge with using a transistor as a switch is that the on resistance of the transistors depend on the gate-to-source voltage of the transistor. This dependance causes the on resistance of the transistor to vary when the voltage of the signal on the signal path varies. To address the voltage-dependent on resistance of the transistor, a bootstrap circuit may be used. The bootstrap circuit (also referred to as a bootstrap switch) is coupled to the gate of the transistor, and generates a gate voltage that tracks the voltage of the signal on the signal path. By tracking the voltage of the signal, the bootstrap circuit causes the gate-to-source voltage of the transistor to be approximately constant, and therefore the on resistance to be approximately constant for good linearity.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a switch transistor, and a bootstrap circuit having an input and an output, wherein the output of the bootstrap circuit is coupled to a gate of the switch transistor. The system also includes a first buffer having an input and an output, wherein the output of the first buffer is coupled to a terminal of the switch transistor. The system further includes a second buffer having an input and an output, wherein the input of the second buffer is coupled to the input of the first buffer, and the output of the second buffer is coupled to the input of the bootstrap circuit.

A second aspects relates to a system. The system includes a first switch transistor, a second switch transistor, a first bootstrap circuit having an input and an output, wherein the output of the first bootstrap circuit is coupled to a gate of the first switch transistor, and a second bootstrap circuit having an input and an output, wherein the output of the second bootstrap circuit is coupled to a gate of the second switch transistor. The system also includes a first buffer having a first input, a second input, a first output, and a second output, wherein the first output of the first buffer is coupled to a terminal of the first switch transistor, and the second output of the first buffer is coupled to a terminal of the second switch transistor. The system further includes a second buffer having a first input, a second input, a first output, and a second output, wherein the first input of the second buffer is coupled to the first input of the first buffer, the second input of the second buffer is coupled to the second input of the first buffer, the first output of the first buffer is coupled to the input of the first bootstrap circuit, and the second output of the first buffer is coupled to the input of the second bootstrap circuit.

A third aspect relates to a method for operating a switch transistor. The method includes receiving an input signal, generating a first output signal based on the input signal using a first buffer, outputting the first output signal to a terminal of the switch transistor, generating a second output signal based on the input signal using a second buffer, boosting a voltage of the second output signal to generate a boosted voltage, and outputting the boosted voltage to a gate of the switch transistor.

A fourth aspect relates to a system. The system includes a switch transistor, means for buffering an input signal to obtain a first output signal and providing the first output signal to a terminal of the switch transistor, means for buffering the input signal to obtain a second output signal, and means for boosting a voltage of the second output signal to obtain a boosted voltage and providing the boosted voltage at a gate of the switch transistor.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A switch transistor may be used in a signal path to selectively block or pass a signal on the signal path. As used herein, a "switch transistor" is a transistor that is used as a switch.

A switch transistor may be implemented with an n-type field effect transistor (NFET), or another type of transistor. The on/off state of a switch transistor may be controlled by controlling the voltage at the gate of the switch transistor. For the example of a switch transistor implemented with an NFET, the switch transistor may be turned on by applying a high voltage to the gate of the switch transistor, and the switch transistor may be turned off by applying a low voltage to the gate of the switch transistor. The switch transistor has an on resistance, which is the resistance across the switch transistor when the switch transistor is turned on (i.e., switched on).

A challenge with using a switch transistor to selectively pass or block a signal on a signal path is that the on resistance of the switch transistor depends on the gate-to-source voltage of the switch transistor. This dependance causes the on resistance of the switch transistor to vary when the voltage of the signal on the signal path varies. The varying on resistance of the switch transistor causes distortion in the signal on the signal path.

Figure 1:
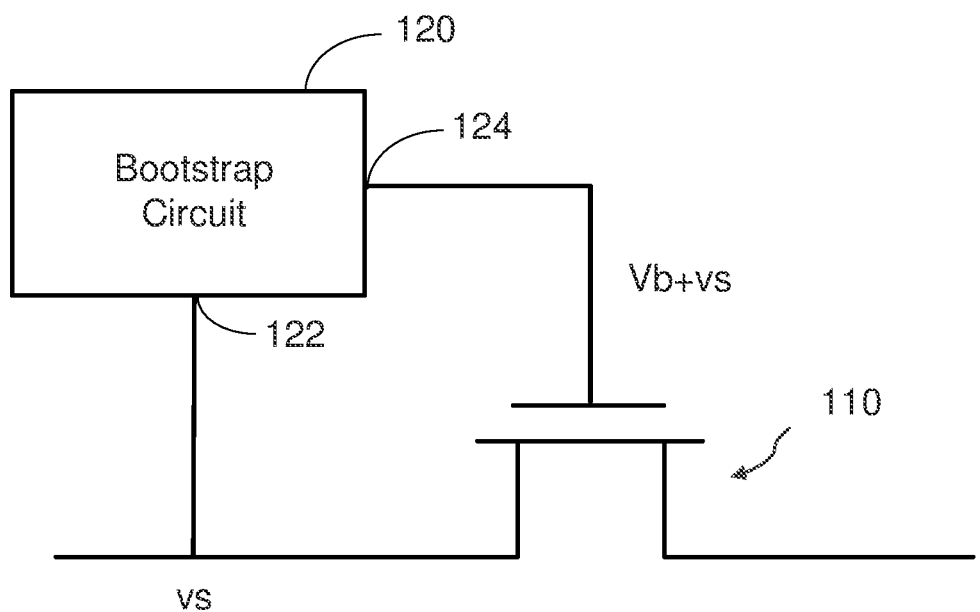
FIG. 1 shows an example of a bootstrap circuit and a switch transistor according to certain aspects of the present disclosure.

To address the voltage-dependent on resistance of the switch transistor, a bootstrap circuit may be used. In this regard, FIG. 1 shows an example of a switch transistor 110 and a bootstrap circuit 120 according to certain aspects. In the example in FIG. 1, the switch transistor 110 is implemented with an NFET. However, it is to be appreciated that the switch transistor 110 may be implemented with another type of transistor such as a p-type field effect transistor (PFET).

In this example, the bootstrap circuit 120 has an input 122 coupled to the signal path, and an output 124 coupled to the gate of the switch transistor 110. The bootstrap circuit 120 is configured to receive the voltage vs of the signal on the signal path via the input 122, and generate a boosted voltage based on the voltage vs. The boosted voltage may be approximately equal to Vb+vs where the voltage Vb may be approximately equal to a supply voltage or another voltage. Thus, in this example, the bootstrap circuit 120 boosts the voltage vs of the signal by the voltage Vb to generate the boosted voltage.

To turn on the switch transistor 110, the bootstrap circuit 120 outputs the boosted voltage to the gate of the switch transistor 110, as shown in FIG. 1. Because the boosted voltage depends on the voltage vs on the signal path, the boosted voltage at the gate of the switch transistor 110 tracks the voltage vs on the signal path. The voltage tracking causes the gate-to-source voltage of the switch transistor 110 to be approximately constant, which causes the on resistance of the switch transistor 110 to be approximately constant for good linearity.

Figure 2:
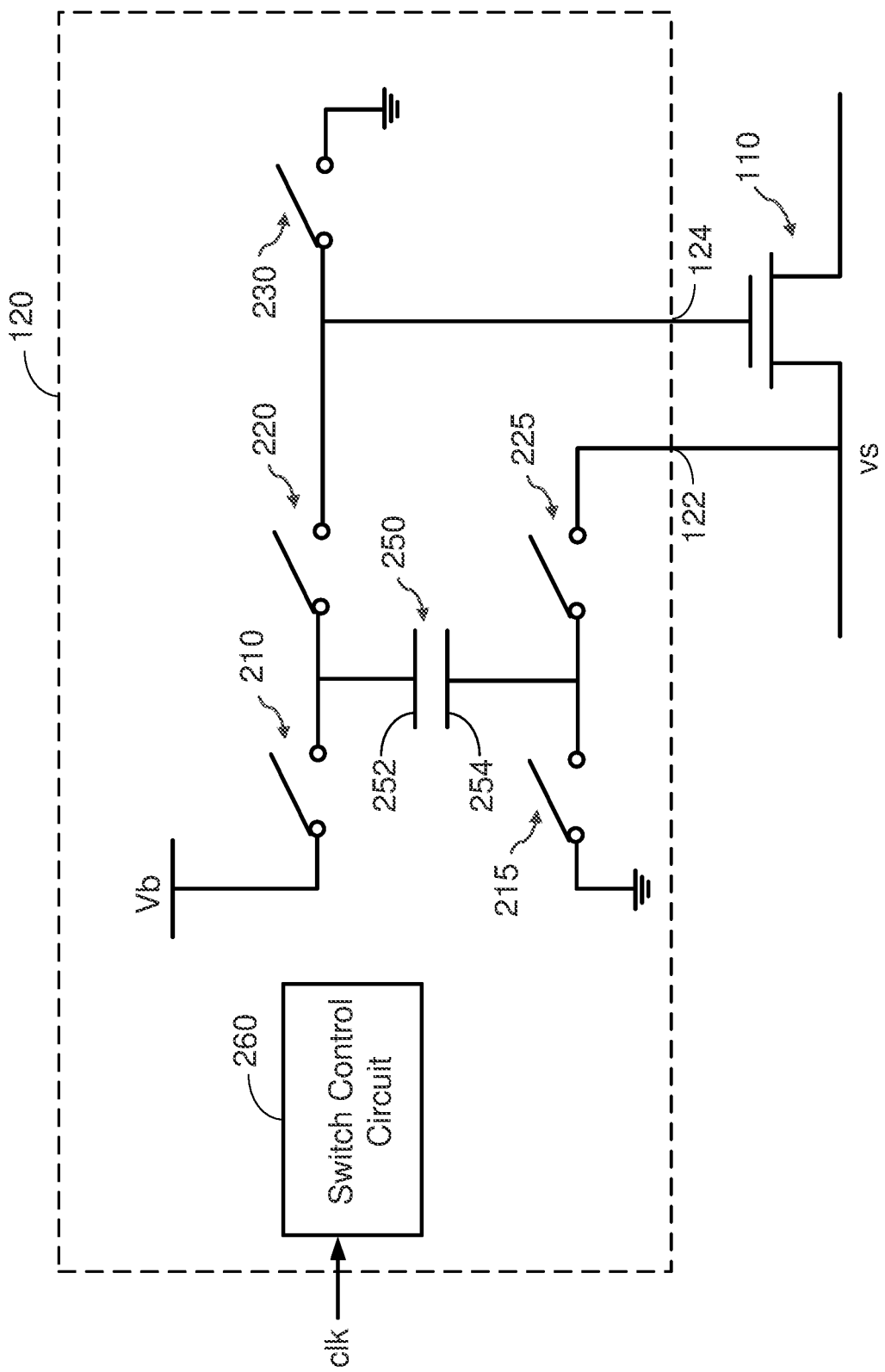
FIG. 2 shows an exemplary implementation of the bootstrap circuit according to certain aspects of the present disclosure.

FIG. 2 shows an exemplary implementation of the bootstrap circuit 120 according to certain aspects. It is to be appreciated that the bootstrap circuit 120 is not limited to the exemplary implementation shown in FIG. 1, and that the bootstrap circuit 120 may be implemented using other circuits known in the art. In other words, it is to be appreciated that the bootstrap circuit 120 is not limited to any one implementation.

In the example in FIG. 2, the bootstrap circuit 120 includes a boost capacitor 250, a first switch 210, a second switch 215, a third switch 220, a fourth switch 225, a fifth switch 230, and a switch control circuit 260. Each of the switches 210, 215, 220, 225, and 230 may be implemented with one or more respective transistors, in which the on/off state of the switch is controlled by controlling the gate voltage of the one or more respective transistors.

The switch control circuit 260 is configured to receive a clock signal clk and control the on/off states of the switches 210, 215, 220, 225, and 230 based on the clock signal clk. For ease of illustration, the individual connections between the switch control circuit 260 and the switches 210, 215, 220, 225, and 230 are not explicitly shown in FIG. 2. The switch control circuit 260 may be implemented with logic gates, transistors, or any combination thereof to perform the functions of the switch control circuit 260 discussed herein.

In this example, the first switch 210 is coupled between a first terminal 252 of the boost capacitor 250 and the voltage Vb. The voltage Vb may also be referred to as a boost voltage or an offset voltage. In one example, the voltage Vb may be provided by a supply rail having a supply voltage Vdd. In this example, the voltage Vb is equal to the supply voltage Vdd, and the first switch 210 is coupled between the first terminal 252 of the boost capacitor 250 and the supply rail. The second switch 215 is coupled between a second terminal 254 of the boost capacitor 250 and ground (or some reference potential). The third switch 220 is coupled between the first terminal 252 of the boost capacitor 250 and the output 124 of the bootstrap circuit 120 (which is coupled to the gate of the switch transistor 110). The fourth switch 225 is coupled between the second terminal 254 of the boost capacitor 250 and the input 122 of the bootstrap circuit 120. The fifth switch 230 is coupled between the output 124 of the bootstrap circuit 120 and ground. It is to be appreciated that a terminal of a capacitor may also be referred to as a plate, an electrode, or another term.

During operation, the bootstrap circuit 120 alternately turns the switch transistor 110 on and off based on the clock signal clk. For example, during each cycle (i.e., a period) of the clock signal clk, the bootstrap circuit 120 may turn off the switch transistor 110 (e.g., to block the signal) during a first phase of the clock cycle, and turn on the switch transistor 110 (e.g., to pass the signal) during a second phase of the clock cycle. The first phase of the clock cycle may be low (e.g., approximately ground), and the second phase of the clock cycle may be high (e.g., approximately Vdd), or vice versa.

Figure 3A:
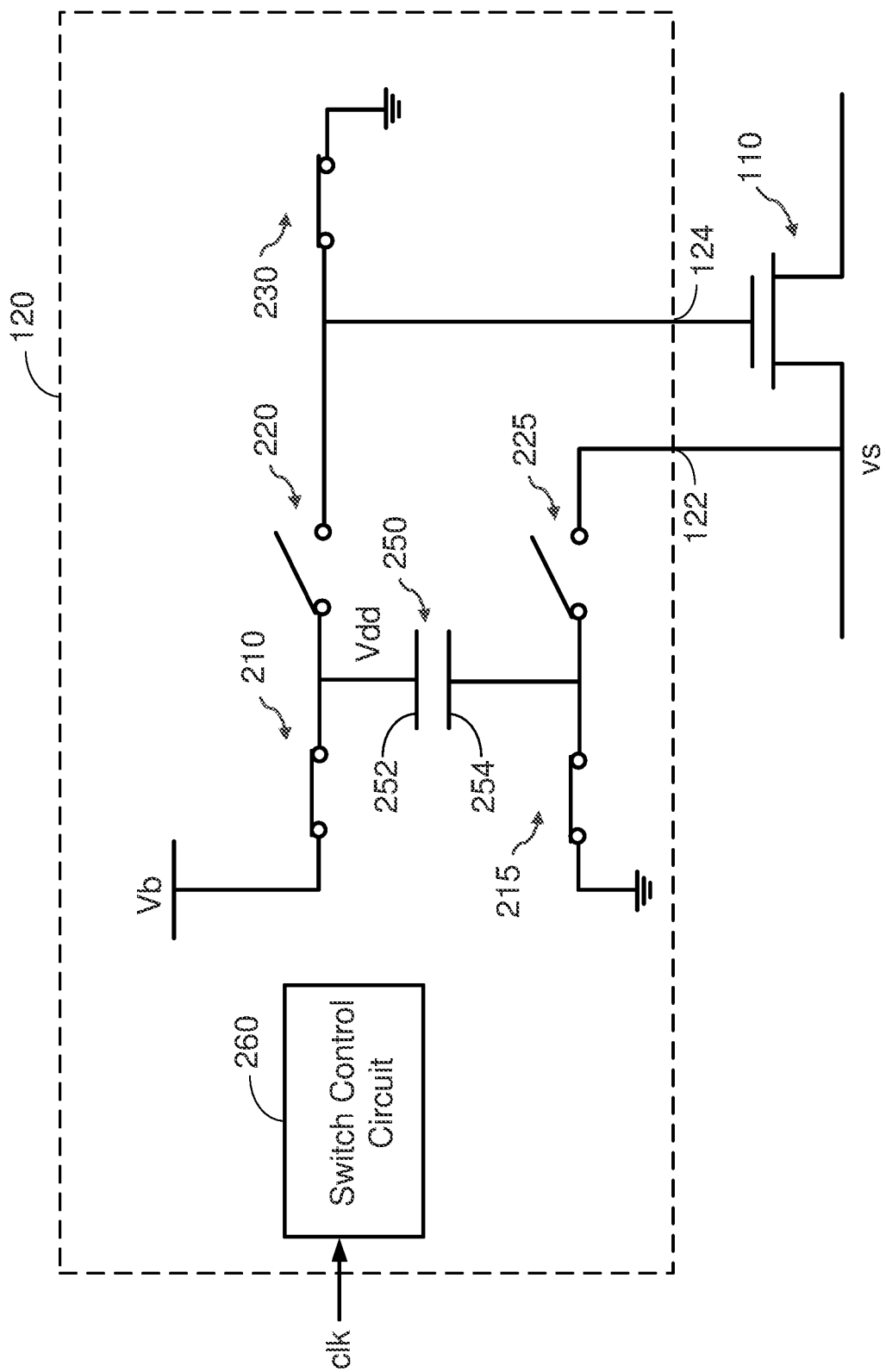
FIG. 3A shows an example of the bootstrap circuit in a first phase according to certain aspects of the present disclosure.

FIG. 3A illustrates the on/off states of the switches 210, 215, 220, 225, and 230 during the first phase of a clock cycle. During the first phase, the switch control circuit 260 turns on the first switch 210, the second switch 215, and the fifth switch 230, and turns off the third switch 220 and the fourth switch 225. As a result, the first terminal 252 of the boost capacitor 250 is coupled to the voltage Vb (e.g., the supply rail) through the first switch 210, and the second terminal 254 of the boost capacitor 250 is coupled to ground through the second switch 215. This causes the boost capacitor 250 to charge to the voltage Vb (e.g., the supply voltage Vdd). Also, the output 124 of the bootstrap circuit 120 is coupled to ground through the fifth switch 230, which turns off the switch transistor 110.

Figure 3B:
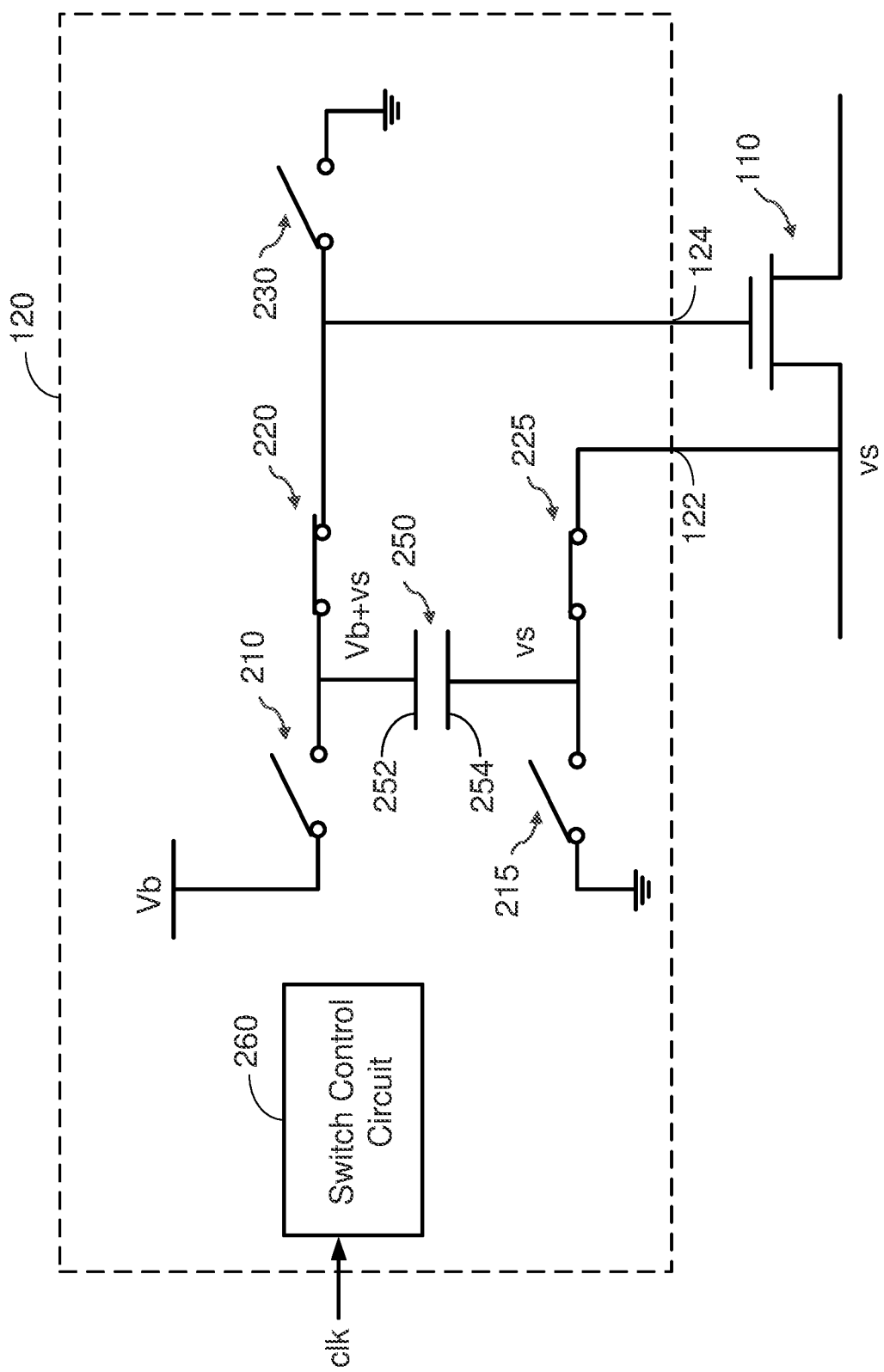
FIG. 3B shows an example of the bootstrap circuit in a second phase according to certain aspects of the present disclosure.

FIG. 3B illustrates the on/off states of the switches 210, 215, 220, 225, and 230 during the second phase of a clock cycle. During the second phase, the switch control circuit 260 turns off the first switch 210, the second switch 215, and the fifth switch 230, and turns on the third switch 220 and the fourth switch 225. As a result, the second terminal 254 of the boost capacitor 250 is coupled to the input 122 of the bootstrap circuit 120 through the fourth switch 225. This causes the voltage at the second terminal 254 of the boost capacitor 250 to be approximately equal to the voltage vs on the signal path, which boosts the voltage at the first terminal 252 of the boost capacitor 250 to a boosted voltage of Vb+vs. The boosted voltage is applied to the gate of the switch transistor 110 through the third switch 220, as shown in FIG. 3B. Thus, in this example, the bootstrap circuit 120 boosts the voltage vs on the signal path by the voltage Vb to generate the boosted voltage. For the example where the voltage Vb is equal to the supply voltage Vdd, the boosted voltage is approximately equal to Vdd+vs.

A challenge with using a bootstrap circuit (e.g., bootstrap circuit 120) is that the bootstrap circuit draws current from the signal path, which may cause a disturbance (e.g., kickback) at a circuit coupled to the signal path. This may be explained by way of example with reference to FIG. 4.

Figure 4:
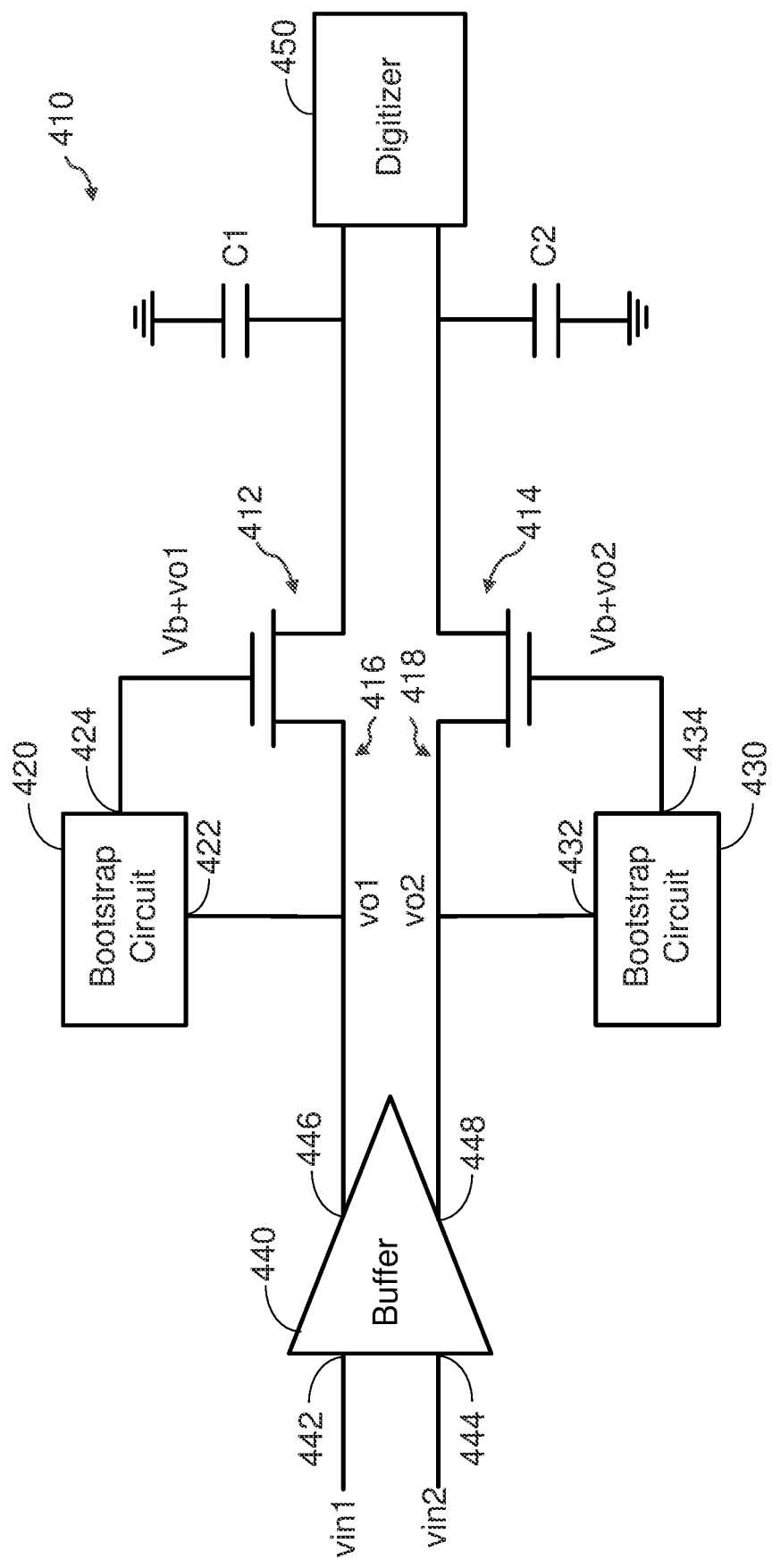
FIG. 4 shows an example of a system including bootstrap circuits, switch transistors, and a buffer according to certain aspects of the present disclosure.

FIG. 4 shows an example of a system 410 including a first switch transistor 412, a second switch transistor 414, a first bootstrap circuit 420, and a second bootstrap circuit 430. The first switch transistor 412 is in a first signal path 416, and the second switch transistor 414 is in a second signal path 418. In the example shown in FIG. 4, each of the switch transistors 412 and 414 is implemented with a respective NFET. However, it is to be appreciated that the present disclosure is not limited to this example.

The first bootstrap circuit 420 has an input 422 coupled to the first signal path 416 and an output 424 coupled to the gate of the first switch transistor 412. The second bootstrap circuit 430 has an input 432 coupled to the second signal path 418 and an output 434 coupled to the gate of the second switch transistor 414. Each of the first bootstrap circuit 420 and the second bootstrap circuit 430 may be implemented with a separate instance (i.e., copy) of the exemplary bootstrap circuit 120. In this example, the input 422 and the output 424 of the first bootstrap circuit 420 may correspond to the input 122 and the output 124, respectively, of the respective instance of the bootstrap circuit 120. Also, the input 432 and the output 434 of the second bootstrap circuit 430 may correspond to the input 122 and the output 124, respectively, of the respective instance of the bootstrap circuit 120. Thus, in this example, the description of the bootstrap circuit 120 given above may be applied to each of the first bootstrap circuit 420 and the second bootstrap circuit 430.

The system 410 also includes a buffer 440 having a first input 442, a second input 444, a first output 446, and a second output 448. The first output 446 of the buffer 440 is coupled to the first signal path 416, and the second output 448 of the buffer 440 is coupled to the second signal path 418. The buffer 440 is configured to receive the input voltages vin1 and vin2 at the first and second inputs 442 and 444, respectively, and drive the first and second signal paths 416 and 414 with output voltages vo2 and vo1, respectively. In certain aspects, the input voltages vin1 and vin2 may be the voltages of a differential signal, but are not limited to this example. The buffer 440 may be implemented with a transimpedance amplifier (TIA), one or more source followers, or another type of buffer.

The system 410 also includes a first capacitor C1 coupled to the first signal path 416, in which the first switch transistor 412 is between the first output 446 of the buffer 440 and the first capacitor C1. The system 410 also includes a second capacitor C2 coupled to the second signal path 418, in which the second switch transistor 414 is between the second output 448 of the buffer 440 and the second capacitor C2. The system 410 may also include a digitizer 450 (also referred to as a quantizer or an analog-to-digital converter) coupled to the first capacitor C1 and the second capacitor C2. The first and second capacitors C1 and C2 may have the same capacitance.

In operation, the system 410 may alternate between a sampling phase (i.e., sample mode) and a hold phase (i.e., hold mode). During the sampling phase, the first bootstrap circuit 420 turns on the first switch transistor 412 by generating and outputting the boosted voltage Vb+vo1 to the gate of the first switch transistor 412 where the boosted voltage tracks the voltage vo1 of the signal on the first signal path 416. Also, the second bootstrap circuit 430 turns on the second switch transistor 414 by generating and outputting the boosted voltage Vb+vo2 to the gate of the second switch transistor 414 where the boosted voltage tracks the voltage vo2 of the signal on the second signal path 418. For the example where each of the first bootstrap circuit 420 and the second bootstrap circuit 430 is implemented with the exemplary bootstrap circuit 120 shown in FIG. 2, the sampling phase corresponds to the second phase of a cycle of the clock signal clk discussed above.

During the hold phase, the first and second bootstrap circuits 420 and 430 turn off the first and second switch transistors 412 and 414, respectively, to hold the voltages on the first and second capacitors C1 and C2, respectively. During the hold phase, the digitizer 450 (i.e., quantizer) converts the voltages on the first and second capacitors C1 and C2 into one or more digital signals. For example, the digitizer 450 may convert the voltage on each of the capacitors C1 and C2 into a respective digital signal, and/or convert a difference between the voltage on the first capacitor C1 and the voltage on the second capacitor C2 into a digital signal. For the example where each of the first bootstrap circuit 420 and the second bootstrap circuit 430 is implemented with the exemplary bootstrap circuit 120 shown in FIG. 2, the hold phase corresponds to the first phase of a cycle of the clock signal clk discussed above.

A challenge with using the bootstrap circuits 420 and 430 is that the bootstrap circuits 420 and 430 can draw a relatively large amount of current from the buffer 440 especially in high-speed applications (e.g., applications where the clock signal clk has a high frequency). The large current causes a disturbance at the buffer 440, which may propagate to the inputs 442 and 444 of the buffer 440 as kickback. The kickback may cause noise at one or more circuits (e.g., a mixer, a receiver, etc.) coupled to the inputs 442 and 444 of the buffer 440.

Figure 5:
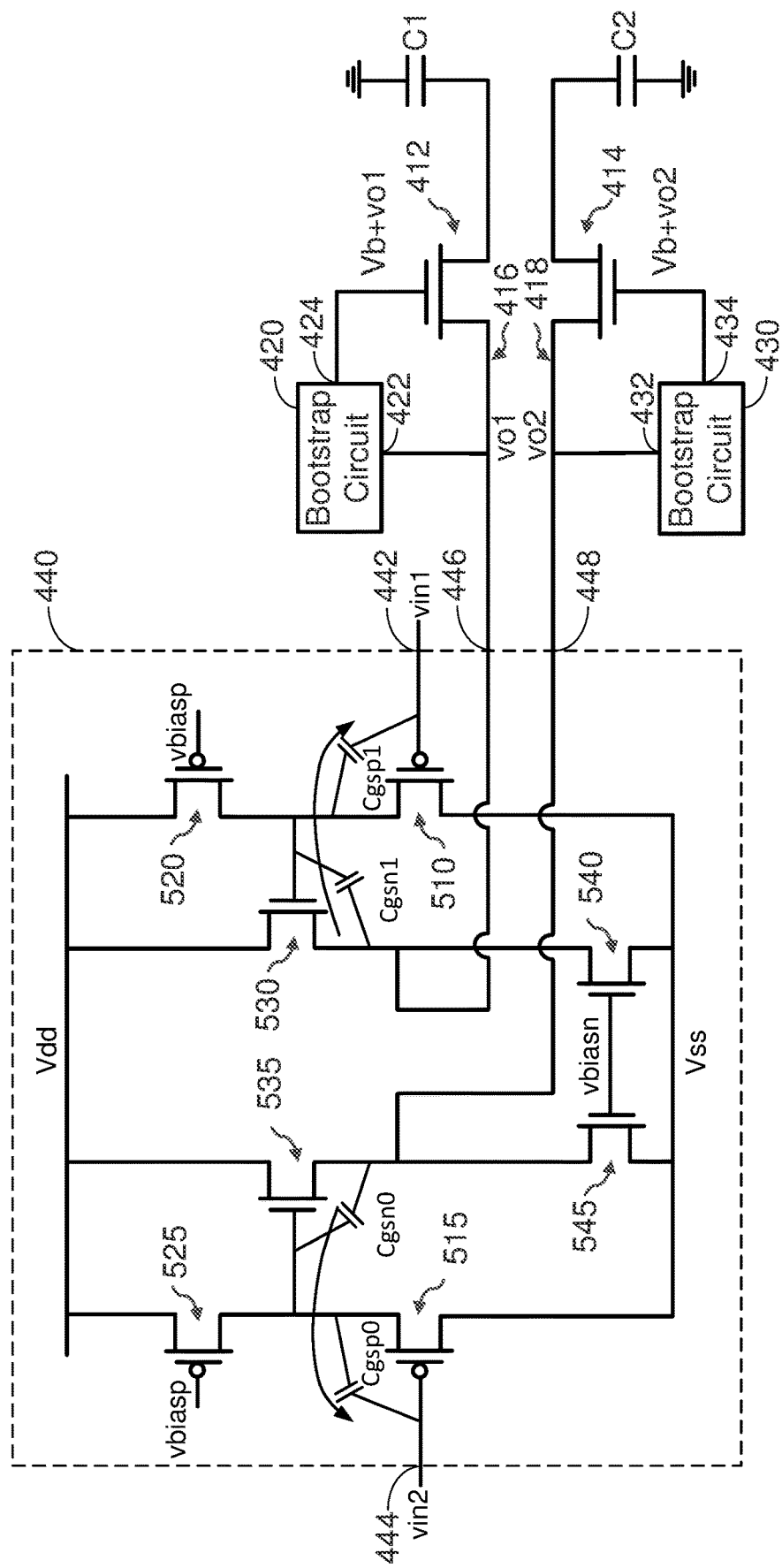
FIG. 5 shows an exemplary implementation of the buffer of FIG. 4 according to certain aspects of the present disclosure.

The buffer 440 may be designed to mitigate kickback. However, this comes at the cost of degrading the noise performance of the buffer 440. An example of the tradeoff between kickback mitigation and noise performance is illustrated in FIG. 5.

In this example, the buffer 440 is implemented with source followers including a first transistor 510, a second transistor 515, a third transistor 520, a fourth transistor 525, a fifth transistor 530, a sixth transistor 535, a seventh transistor 540, and an eighth transistor 545. The first transistor 510 has a gate coupled to the first input 442 of the buffer 440, and a drain coupled to a low rail, in which the low rail has a potential Vss (e.g., ground potential) that is lower than the supply voltage Vdd (i.e., the low rail has a lower potential than the supply rail). The third transistor 520 has a source coupled to the supply rail, a gate that is biased by a bias voltage vbiasp, and a drain coupled to the source of the first transistor 510. The supply rail and the low rail may also be referred to as a first rail and a second rail, respectively, or the low rail and the supply rail may also be referred to as a first rail and a second rail, respectively.

The second transistor 515 has a gate coupled to the second input 444 of the buffer 440, and a drain coupled to the low rail. The fourth transistor 525 has a source coupled to the supply rail, a gate that is biased by the bias voltage vbiasp, and a drain coupled to the source of the second transistor 515. In this example, each of the first transistor 510, the second transistor 515, the third transistor 520, and the fourth transistor 525 is implemented with a respective PFET. However, it is to be appreciated that the present disclosure is not limited to this example.

The fifth transistor 530 has a gate coupled to the source of the first transistor 510, a drain coupled to the supply rail, and a source coupled to the first output 446 of the buffer 440. The seventh transistor 540 has a drain coupled to the source of the fifth transistor 530, a gate that is biased by a bias voltage vbiasn, and a source coupled to the low rail.

The sixth transistor 535 has a gate coupled to the source of the second transistor 515, a drain coupled to the supply rail, and a source coupled to the second output 448 of the buffer 440. The eighth transistor 545 has a drain coupled to the source of the sixth transistor 535, a gate that is biased by the bias voltage vbiasn, and a source coupled to the low rail. In this example, each of the fifth transistor 530, the sixth transistor 535, the seventh transistor 540, and the eighth transistor 545 is implemented with a respective NFET. However, it is to be appreciated that the present disclosure is not limited to this example.

To reduce noise on the signal paths 416 and 418, the transistors 510, 515, 530, and 535 may be sized large. This is because increasing the gate area of a transistor tends to reduce noise (e.g., flicker noise) on the transistor. However, making the transistors 510, 515, 530, and 535 large to reduce noise introduces large parasitic gate-source capacitances Cgsn0, Cgsn1, Cgsp0, and Cgsp1 shown in FIG. 5, which increase kickback from the outputs 446 and 448 of the buffer 440 to the inputs 442 and 444 of the buffer 440. In FIG. 5, the kickback is indicated by the arrows pointing to the inputs 442 and 444 of the buffer 440. Because of the tradeoff between kickback mitigation and noise performance using this approach, it is very difficult to achieve both a low noise and reduced kickback.

In the example shown in FIG. 5, the buffer 440 is a two-stage buffer with a first stage including the transistors 510, 515, 520, and 525, and a second stage including the transistors 530, 535, 540, and 545. It is to be appreciated that the buffer 440 is not limited to this example, and that, in some implementations, the buffer 440 may be a single stage buffer that includes one of the first stage and the second stage. For example, in some implementations, the buffer 440 may be a single stage buffer that includes the second stage with the first stage omitted. In this example, the gate of the transistor 530 may be coupled to the first input 442 and the gate of the transistor 535 may be coupled to the second input 444, or vice versa. In this example, the buffer 440 suffers from kickback due to the presence of the parasitic gate-source capacitances Cgsn0 and Cgsn1.

Aspects of the present disclosure achieve both low noise and reduced kickback by using separate buffers for driving one or more signal paths and driving one or more bootstrap circuits. The buffer driving the one or more signal paths may be configured for low noise while the buffer driving the one or more bootstrap circuits may be configured for reduced kickback. By using separate buffers for driving the one or more signal paths and driving the one or more bootstrap circuits both low noise and reduced kickback can be achieved, as discussed further below.

Figure 6:
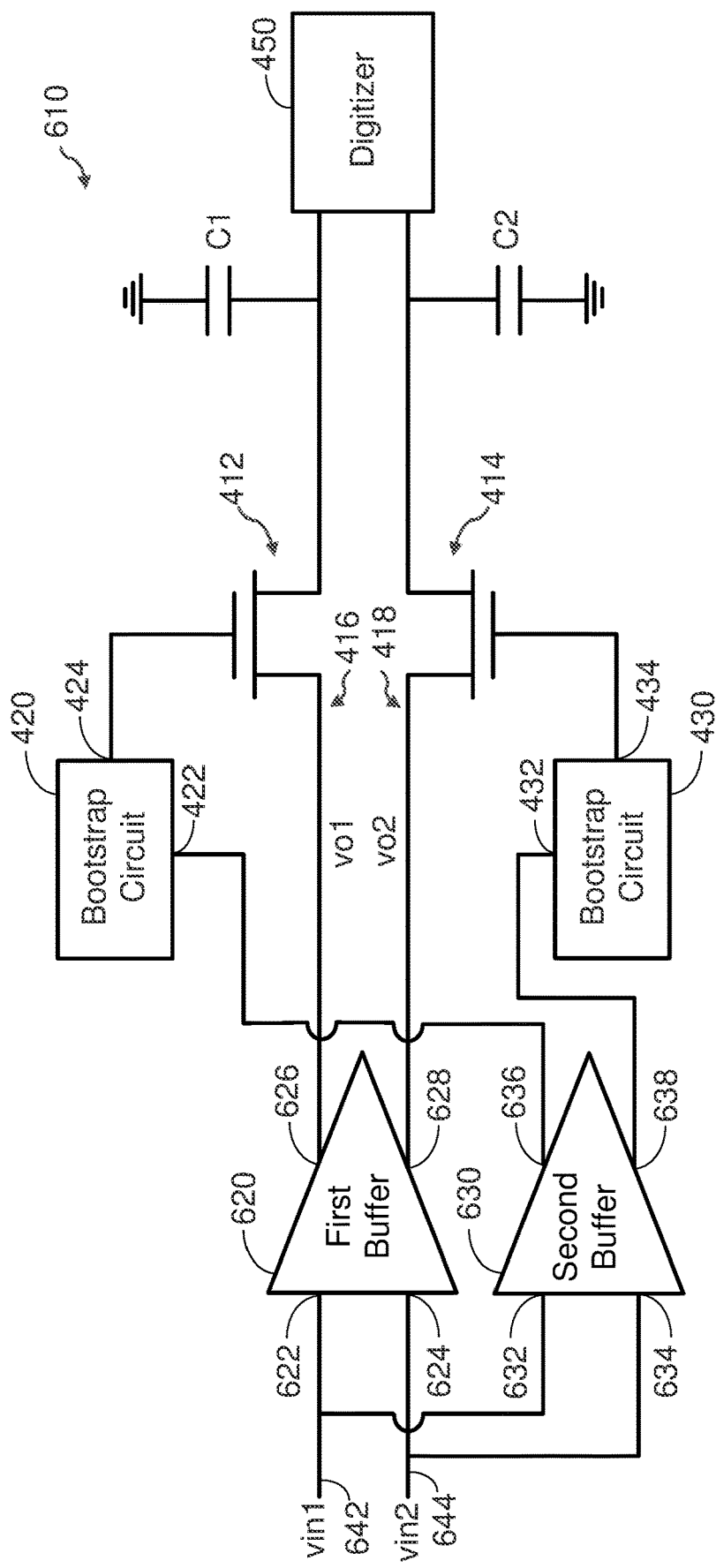
FIG. 6 shows an example of a system including a first buffer coupled to signal paths with switch transistors and a second buffer coupled to bootstrap circuits according to certain aspects of the present disclosure.

FIG. 6 shows an example of a system 610 according to aspects of the present disclosure. The system 610 includes the first bootstrap circuit 420, the second bootstrap circuit 430, the first switch transistor 412, and the second switch transistor 414 discussed above with reference to FIG. 4. The system 610 may also include the capacitors C1 and C2, and the digitizer 450 discussed above.

The system 610 also includes a first buffer 620 and a second buffer 630. Each of the first buffer 620 and the second buffer 630 may be implemented with a separate instance of the exemplary buffer 440 shown in FIG. 5 discussed above. However, it is to be appreciated that transistor sizes in the first buffer 620 and the second buffer 630 may differ, as discussed further below. It is also to be appreciated that the first buffer 620 and the second buffer 630 are not limited to the exemplary implementation shown in FIG. 5.

In this example, the first input 622 of the first buffer 620 and the first input 632 of the second buffer 630 are coupled to a first common input 642 to receive input voltage vin1, and the second input 624 of the first buffer 620 and the second input 634 of the second buffer 630 are coupled to a second common input 644 to receive input voltage vin2. Thus, in this example, the first and second buffers 620 and 630 receive the same input voltages vin1 and vin2.

The first output 626 of the first buffer 620 is coupled to the first signal path 416, and the second output 628 of the first buffer 620 is coupled to the second signal path 418. Thus, the first and second outputs 626 and 628 of the first buffer 620 drive the first and second signal paths 416 and 418 based on the input voltages vin1 and vin2. In the example shown in FIG. 6, the first output 626 of the first buffer 620 is coupled to a terminal (e.g., source) of the first switch transistor 412, and the second output 628 of the first buffer 620 is coupled to a terminal (e.g., source) of the second switch transistor 414. As used herein, a terminal of a transistor may refer to a source or a drain of the transistor.

In this example, the first buffer 620 may be configured for low noise to reduce noise on the signal paths 416 and 418. For example, transistors in the first buffer 620 may be sized large (e.g., large relative to transistors in the second buffer 630) to reduce noise (e.g., the gate area of each of the transistors may be made large to reduce noise). For the example where the first buffer 620 is implemented with an instance of the exemplary buffer 440 shown in FIG. 5, the transistors 530 and 535 in the first buffer 620 may be sized large to reduce noise, or all the transistors 510, 515, 530, and 535 in the first buffer 620 may be sized large to reduce noise.

The first output 636 of the second buffer 630 is coupled to the input 422 of the first bootstrap circuit 420. As a result, the first bootstrap circuit 420 generates a first boosted voltage for the first switch transistor 412 based on the voltage at the first output 636 of the second buffer 630. Since the second buffer 630 receives the same input voltages vin1 and vin2 as the first buffer 620, the voltage at the first output 636 of the second buffer 630 tracks the voltage vo1 at the first output 626 of the first buffer 620. This allows the first boosted voltage from the first bootstrap circuit 420 to track the voltage vo1 on the first signal path 416 for good switch linearity while isolating the first output 626 of the first buffer 620 from the input 422 of the first bootstrap circuit 420.

The second output 638 of the second buffer 630 is coupled to the input 432 of the second bootstrap circuit 430. As a result, the second bootstrap circuit 430 generates a second boosted voltage for the second switch transistor 430 based on the voltage at the second output 638 of the second buffer 630. Since the second buffer 630 receives the same input voltages vin1 and vin2 as the first buffer 620, the voltage at the second output 638 of the second buffer 630 tracks the voltage vo2 at the second output 628 of the first buffer 620. This allows the second boosted voltage from the second bootstrap circuit 430 to track the voltage vo2 on the second signal path 418 for good switch linearity while isolating the second output 628 of the first buffer 620 from the input 432 of the second bootstrap circuit 430.

Thus, the second buffer 630 drives the inputs 422 and 432 of the bootstrap circuits 420 and 430 based on the input voltages vin1 and vin2. In this example, the second buffer 630 may be configured to reduce kickback from the bootstrap circuits 420 and 430 to the common inputs 642 and 644. For example, transistors in the second buffer 630 may be sized small compared with the transistors in the first buffer 620 to reduce kickback. For the example where the second buffer 630 is implemented with an instance of the exemplary buffer 440 shown in FIG. 5, the transistors 530 and 535 in the second buffer 630 may be sized small to reduce kickback (e.g., small relative to transistors in the first buffer 620), or all the transistors 510, 515, 530, and 535 in the second buffer 630 may be sized small to reduce kickback.

Thus, the first buffer 620 is used to drive the signal paths 416 and 418, and the second buffer 630 is used to drive the inputs 422 and 432 of the bootstrap circuits 420 and 430. This helps decouple noise performance for the signal paths 416 and 418 from kickback caused by currents drawn from the inputs 422 and 432 of the bootstrap circuits 420 and 430. Decoupling noise performance and kickback mitigation allows the first buffer 620 to be configured for low noise and the second buffer 630 to be configured for reduced kickback to achieve both low noise and reduced kickback.

Figure 7:
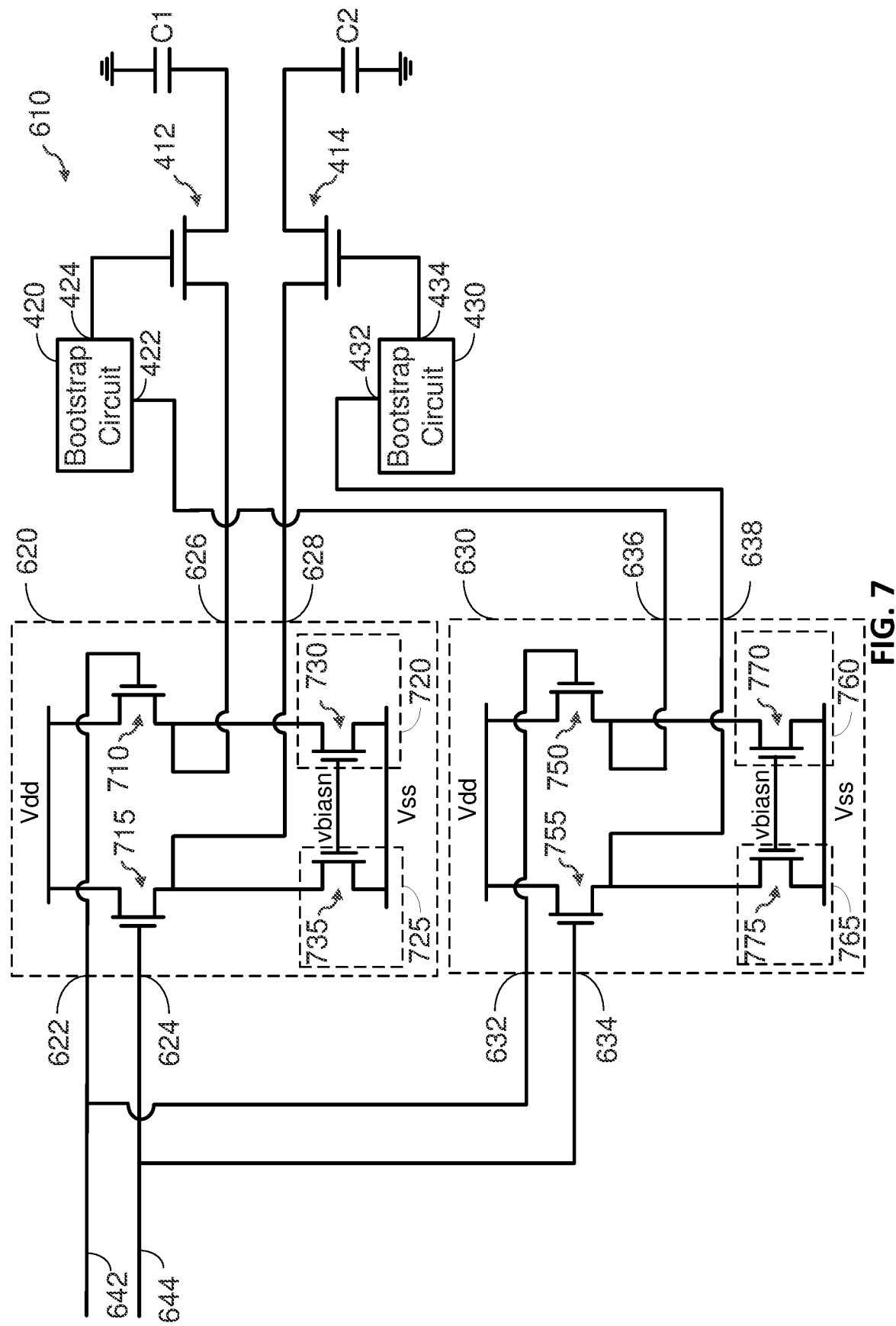
FIG. 7 shows an exemplary implementation of the first buffer and the second buffer of FIG. 6 according to certain aspects of the present disclosure.

FIG. 7 shows an exemplary implementation of the first buffer 620 and the second buffer 630 according to certain aspects. In this example, the first buffer 620 includes a first transistor 710, a second transistor 715, a first load 720, and a second load 725. The first transistor 710 has a gate coupled to the first input 622 of the first buffer 620, a drain coupled to the supply rail, and a source coupled to the first output 626 of the first buffer 620. The first load 720 is coupled between the first output 626 and the low rail.

The second transistor 715 has a gate coupled to the second input 624 of the first buffer 620, a drain coupled to the supply rail, and a source coupled to the second output 628 of the first buffer 620. The second load 725 is coupled between the second output 628 and the low rail.

In this example, each of the first transistor 710 and the second transistor 715 is configured in a source-follower configuration (also referred to as a common-drain configuration).

Also, in this example, each of the first transistor 710 and the second transistor 715 is implemented with a respective NFET. However, it is to be appreciated that the present disclosure is not limited to this example.

Each of the first load 720 and the second load 725 may be implemented with an active load, a passive load, or a combination thereof. In the example shown in FIG. 7, the first load 720 is implemented with a transistor 730 (e.g., NFET) having a drain coupled to the first output 626, a gate that is biased by a bias voltage vbiasn, and a source coupled to the low rail. The second load 725 is implemented with a transistor 735 (e.g., NFET) having a drain coupled to the second output 628, a gate that is biased by the bias voltage vbiasn, and a source coupled to the low rail. However, it is to be appreciated that the first load 720 and the second load 725 are not limited to this example.

In the example in FIG. 7, the second buffer 630 includes a first transistor 750, a second transistor 755, a first load 760, and a second load 765. The first transistor 750 has a gate coupled to the first input 632 of the second buffer 630, a drain coupled to the supply rail, and a source coupled to the first output 636 of the second buffer 630. The first load 760 is coupled between the first output 636 and the low rail.

The second transistor 755 has a gate coupled to the second input 634 of the second buffer 630, a drain coupled to the supply rail, and a source coupled to the second output 638 of the second buffer 630. The second load 765 is coupled between the second output 638 and the low rail.

In this example, each of the first transistor 750 and the second transistor 755 is configured in a source-follower configuration. Also, in this example, each of the first transistor 750 and the second transistor 755 is implemented with a respective NFET. However, it is to be appreciated that the present disclosure is not limited to this example.

Each of the first load 760 and the second load 765 may be implemented with an active load, a passive load, or a combination thereof. In the example shown in FIG. 7, the first load 760 is implemented with a transistor 770 (e.g., NFET) having a drain coupled to the first output 636, a gate that is biased by the bias voltage vbiasn, and a source coupled to the low rail. The second load 765 is implemented with a transistor 775 (e.g., NFET) having a drain coupled to the second output 638, a gate that is biased by the bias voltage vbiasn, and a source coupled to the low rail. However, it is to be appreciated that the first load 760 and the second load 765 are not limited to this example.

In this example, the first buffer 620 may be configured for low noise and the second buffer 630 may be configured for reduced kickback by making the first and second transistors 710 and 715 in the first buffer 620 a different size (e.g., larger) than the first and second transistors 750 and 755 in the second buffer 630. For example, in some implementations, a gate area of each of the first and second transistors 710 and 715 in the first buffer 620 may be at least twice as large as a gate area of each of the first and second transistors 750 and 755 in the second buffer 630.

For example, the gate area of each of the first and second transistors 710 and 715 in the first buffer 620 may be made larger than the gate area of each of the first and second transistors 750 and 755 in the second buffer 630 by making the gate length and/or the gate width of each of the first and second transistors 710 and 715 in the first buffer 620 larger than the gate length and/or the gate width of each of the first and second transistors 750 and 755 in the second buffer 630. As used herein, the "gate length" of a transistor is the dimension of the gate that extends between the drain and the source of the transistor, and the "gate width" is the dimension of the gate that extends in a direction perpendicular to the gate length.

In certain aspects, the transconductance (i.e., gm) of each of the first and second transistors 750 and 755 in the second buffer 630 may be made large to supply the input of the respective bootstrap circuit 420 and 430 with a large current. Assuming the transconductance of each of the first and second transistors 750 and 755 is proportional to W/L where W is gate width and L is gate length, higher transconductance may be achieved for a given gate width by reducing the gate length of each of the first and second transistors 750 and 755. Reducing the gate length of each of the first and second transistors 750 and 755 to increase transconductance also reduces the gate area of each of the first and second transistors 750 and 755 for a given gate width. This allows each of the first and second transistors 750 and 755 in the second buffer 630 to achieve high transconductance while reducing gate area for reduced kickback. For example, in some implementations, the gate length of each of the first and second transistors 710 and 715 in the first buffer 620 may be at least twice as large (i.e., long) as the gate length of each of the first and second transistors 750 and 755 in the second buffer 630.

Figure 8:
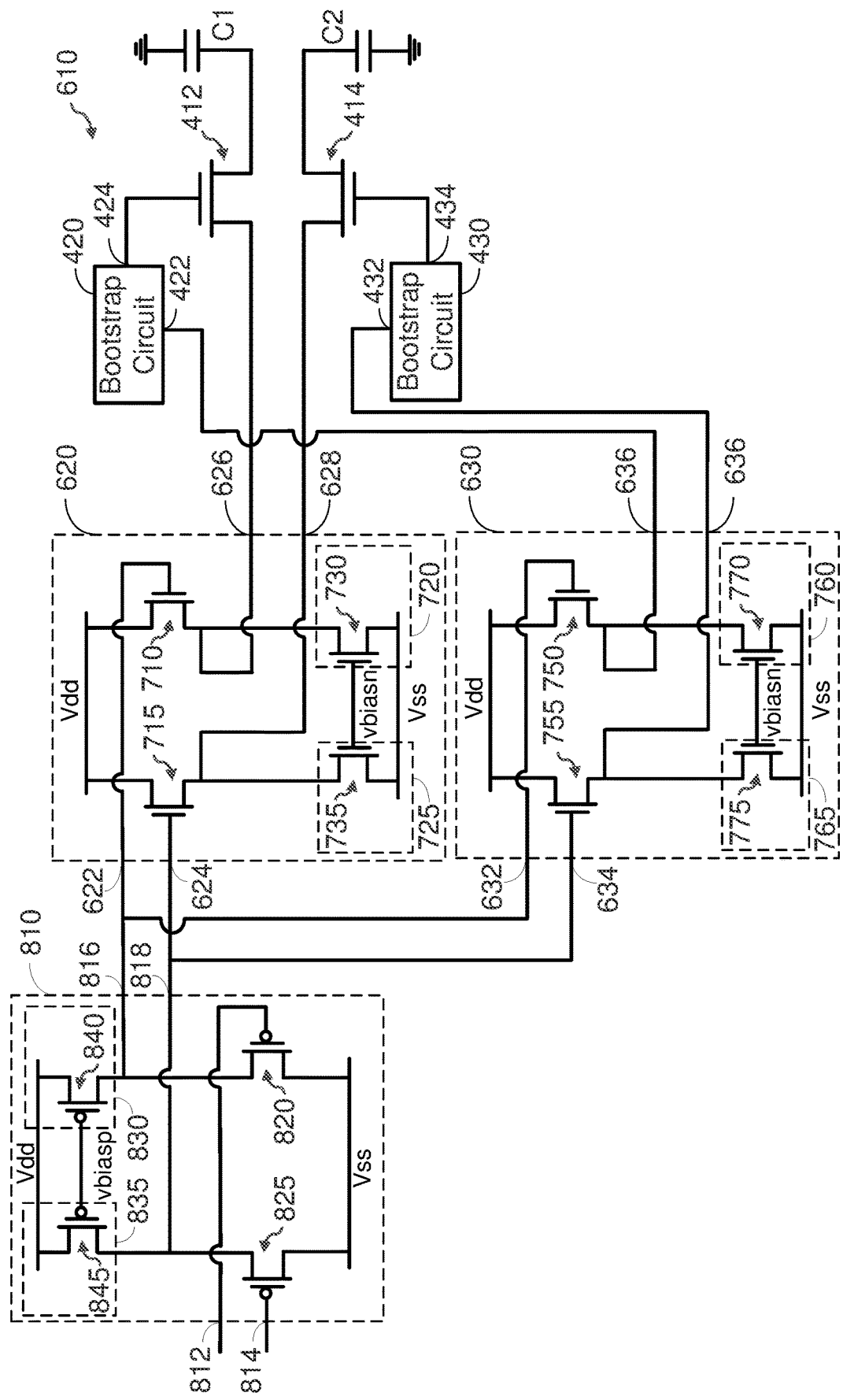
FIG. 8 shows an example of a system including a third buffer according to certain aspects of the present disclosure.

FIG. 8 shows an example in which the system 610 includes a third buffer 810 according to certain aspects. In this example, the third buffer 810 drives the inputs 622 and 624 of the first buffer 620 and the inputs 632 and 634 of the second buffer 630. The third buffer 810 may be used, for example, to increase drive strength.

The third buffer 810 has a first input 812, a second input 814, a first output 816, and a second output 818. The first input 812 is configured to receive a first input signal, and the second input 814 is configured to receive a second input signal from a preceding circuit (not shown). The preceding circuit may include one or more mixers, a receiver, one or more low-noise amplifiers, one or more filters, etc. The first output 816 is coupled to the first input 622 of the first buffer 620 and the first input 632 of the second buffer 630. The second output 818 is coupled to the second input 624 of the first buffer 620 and the second input 634 of the second buffer 630.

In the example in FIG. 8, the third buffer 810 includes a first transistor 820, a second transistor 825, a first load 830, and a second load 835. The first transistor 820 has a gate coupled to the first input 812 of the third buffer 810, a drain coupled to the low rail, and a source coupled to the first output 816 of the third buffer 810. The first load 830 is coupled between the first output 816 and the supply rail.

The second transistor 825 has a gate coupled to the second input 814 of the third buffer 810, a drain coupled to the low rail, and a source coupled to the second output 818 of the third buffer 810. The second load 835 is coupled between the second output 818 and the supply rail.

In this example, each of the first transistor 820 and the second transistor 825 is configured in a source-follower configuration. Also, in this example, each of the first transistor 820 and the second transistor 825 is implemented with a respective PFET. However, it is to be appreciated that the present disclosure is not limited to this example.

Each of the first load 830 and the second load 835 may be implemented with an active load, a passive load, or a combination thereof. In the example shown in FIG. 8, the first load 830 is implemented with a transistor 840 (e.g., PFET) having a drain coupled to the first output 816, a gate that is biased by a bias voltage vbiasp, and a source coupled to the supply rail. The second load 835 is implemented with a transistor 845 (e.g., PFET) having a drain coupled to the second output 818, a gate that is biased by the bias voltage vbiasp, and a source coupled to the supply rail. However, it is to be appreciated that the first load 830 and the second load 835 are not limited to this example.

In this example, the third buffer 810 and the first buffer 620 in combination may implement a first instance of the exemplary two-stage buffer 440 shown in FIG. 5, and the third buffer 810 and the second buffer 630 in combination may implemented a second instance of the exemplary two-stage buffer 440 shown in FIG. 5, in which the third buffer 810 is shared by the first instance and the second instance of the exemplary buffer 440.

However, it is to be appreciated that the first buffer 620, the second buffer 630, and the third buffer 810 are not limited to this example.

In the example shown in FIG. 8, the transistors 710 and 715 in the first buffer 620 are implemented with NFETs. As a result, the transistor 710 shifts the voltage at the input 622 downward at the output 626 by the gate-to-source voltage of the transistor 710, and the transistor 715 shifts the voltage at the input 624 downward at the output 628 by the gate-to-source voltage of the transistor 715. For cases where the input voltages of the system 610 are high (e.g., above the gate-to-source voltages of the transistors 710 and 715), the input voltages may be input to the inputs 622 and 624 of the first buffer 620 without the third buffer 810. For cases where the input voltages of the system 610 are low (e.g., below the gate-to-source voltages of the transistors 710 and 715), the third buffer 810 may be used to shift the input voltages upward before they are input to the inputs 622 and 624 of the first buffer 620. In the example shown in FIG. 8, the transistors 820 and 825 in the third buffer 820 shift the voltages at the inputs 812 and 814 upward since the transistors 820 and 825 are implemented with PFETs in this example.

In the example shown in FIG. 8, the transistors 750 and 755 in the second buffer 630 are also implemented with NFETs, and therefore shift the voltages at the inputs 632 and 634 downward. For cases where the input voltages of the system 610 are high (e.g., above the gate-to-source voltages of the transistors 750 and 755), the input voltages may be input to the inputs 632 and 634 of the second buffer 630 without the third buffer 810. For cases where the input voltages of the system 610 are low (e.g., below the gate-to-source voltages of the transistors 750 and 755), the third buffer 810 may be used to shift the input voltages upward before they are input to the inputs 632 and 634 of the second buffer 630.

Figure 9:
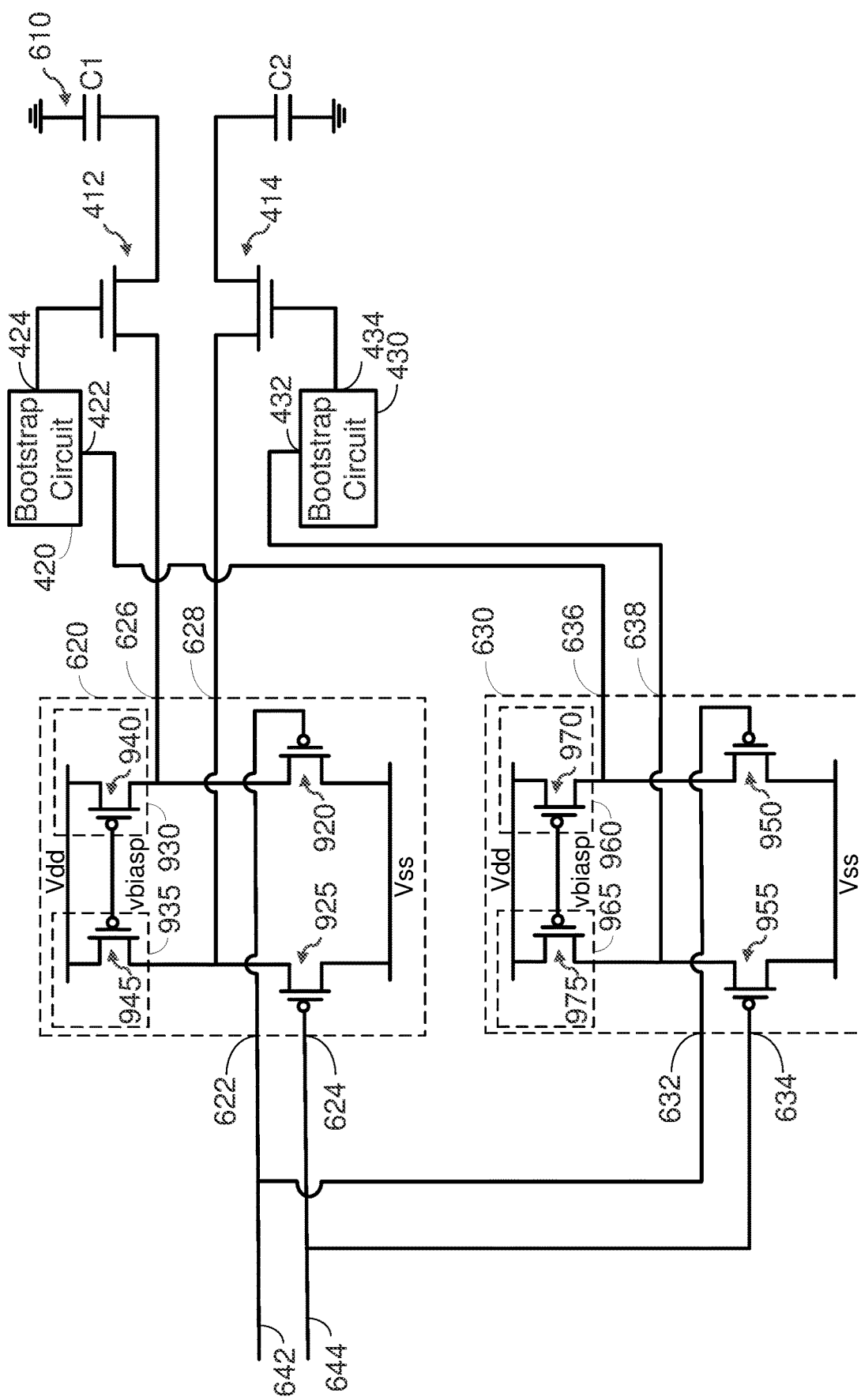
FIG. 9 shows another exemplary implementation of a first buffer and a second buffer according to certain aspects of the present disclosure.

FIG. 9 shows another exemplary implementation of the first buffer 620 and the second buffer 630 according to certain aspects of the present disclosure. In this example, the first buffer 620 includes a first transistor 920, a second transistor 925, a first load 930, and a second load 935. The first transistor 920 has a gate coupled to the first input 622 of the first buffer 620, a drain coupled to the low rail, and a source coupled to the first output 626 of the first buffer 620. The first load 930 is coupled between the first output 626 and the supply rail.

The second transistor 925 has a gate coupled to the second input 624 of the first buffer 620, a drain coupled to the low rail, and a source coupled to the second output 628 of the first buffer 620. The second load 935 is coupled between the second output 628 and the supply rail.

In this example, each of the first transistor 920 and the second transistor 925 is configured in a source-follower configuration. Also, in this example, each of the first transistor 920 and the second transistor 925 is implemented with a respective PFET. However, it is to be appreciated that the present disclosure is not limited to this example.

Each of the first load 930 and the second load 935 may be implemented with an active load, a passive load, or a combination thereof. In the example shown in FIG. 9, the first load 930 is implemented with a transistor 940 (e.g., PFET) having a drain coupled to the first output 626, a gate that is biased by a bias voltage vbiasp, and a source coupled to the supply rail. The second load 935 is implemented with a transistor 945 (e.g., PFET) having a drain coupled to the second output 628, a gate that is biased by the bias voltage vbiasp, and a source coupled to the supply rail. However, it is to be appreciated that the first load 930 and the second load 935 are not limited to this example.

In this example, the second buffer 630 includes a first transistor 950, a second transistor 955, a first load 960, and a second load 965. The first transistor 950 has a gate coupled to the first input 632 of the second buffer 630, a drain coupled to the low rail, and a source coupled to the first output 636 of the second buffer 630. The first load 960 is coupled between the first output 636 and the supply rail.

The second transistor 955 has a gate coupled to the second input 634 of the second buffer 630, a drain coupled to the low rail, and a source coupled to the second output 638 of the second buffer 630. The second load 965 is coupled between the second output 638 and the supply rail.

In this example, each of the first transistor 950 and the second transistor 955 is configured in a source-follower configuration. Also, in this example, each of the first transistor 950 and the second transistor 955 is implemented with a respective PFET. However, it is to be appreciated that the present disclosure is not limited to this example.

Each of the first load 960 and the second load 965 may be implemented with an active load, a passive load, or a combination thereof. In the example shown in FIG. 9, the first load 960 is implemented with a transistor 970 (e.g., PFET) having a drain coupled to the first output 636, a gate that is biased by the bias voltage vbiasp, and a source coupled to the supply rail. The second load 965 is implemented with a transistor 975 (e.g., PFET) having a drain coupled to the second output 638, a gate that is biased by the bias voltage vbiasp, and a source coupled to the supply rail. However, it is to be appreciated that the first load 960 and the second load 965 are not limited to this example.

In this example, the first buffer 620 may be configured for low noise and the second buffer 630 may be configured for reduced kickback by making the first and second transistors 920 and 925 in the first buffer 620 larger than the first and second transistors 950 and 955 in the second buffer 630. For example, in some implementations, a gate area of each of the first and second transistors 920 and 925 in the first buffer 620 may be at least twice as large as a gate area of each of the first and second transistors 950 and 955 in the second buffer 630.

For example, the gate area of each of the first and second transistors 920 and 925 in the first buffer 620 may be made larger than the gate area of each of the first and second transistors 950 and 955 in the second buffer 630 by making the gate length and/or the gate width of each of the first and second transistors 920 and 925 in the first buffer 620 larger than the gate length and/or the gate width of each of the first and second transistors 950 and 955 in the second buffer 630. In some implementations, the gate length of each of the first and second transistors 920 and 925 in the first buffer 620 may be at least twice as large (i.e., long) as the gate length of each of the first and second transistors 950 and 955 in the second buffer 630.

Figure 10:
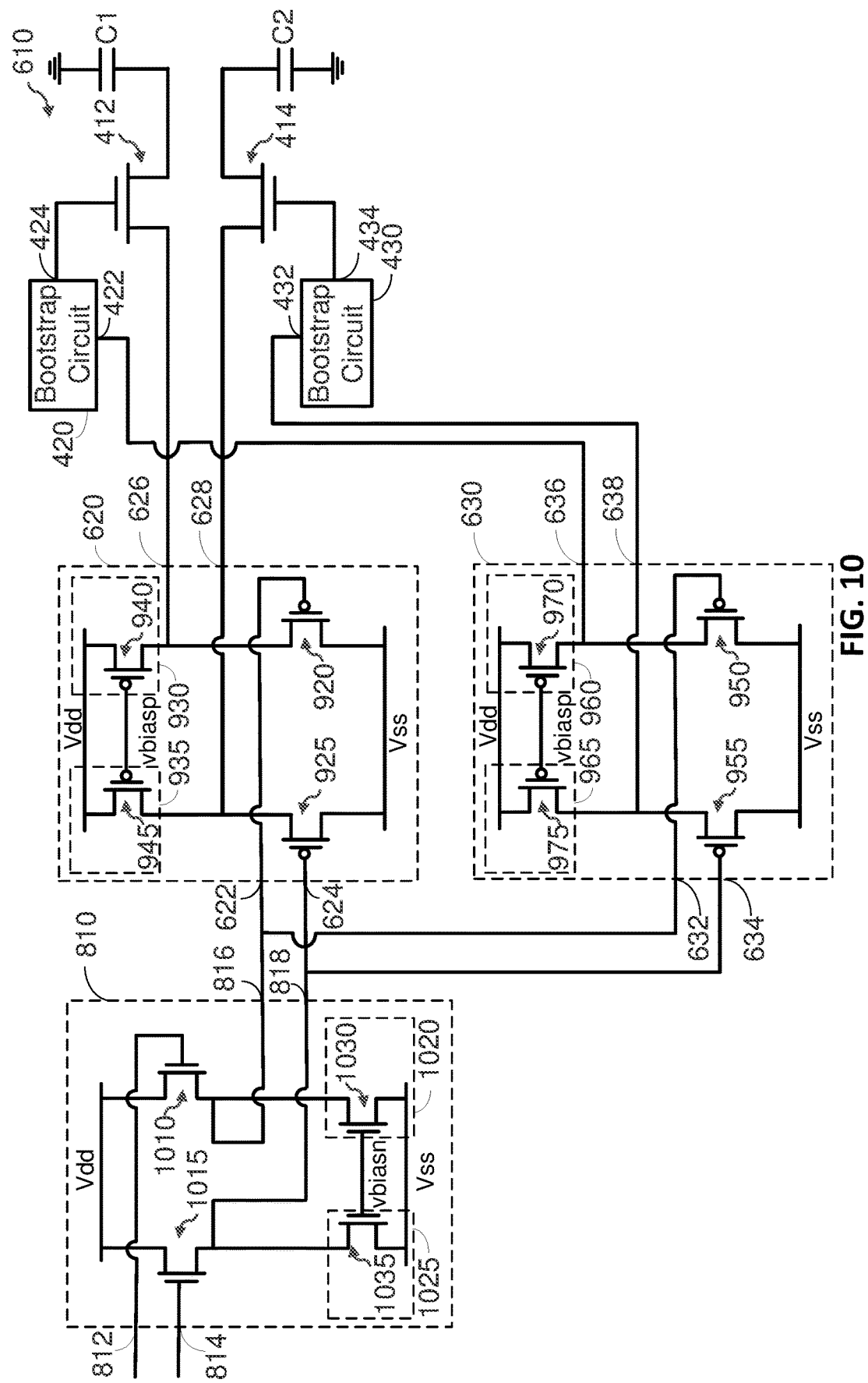
FIG. 10 shows another example of a system including a third buffer according to certain aspects of the present disclosure.

The exemplary system 610 shown in FIG. 9 may include the third buffer 810 is some implementations. For example, FIG. 10 shows an example in which the system 610 in FIG. 9 includes the third buffer 810. In this example, the third buffer 810 includes a first transistor 1010, a second transistor 1015, a first load 1020, and a second load 1025. The first transistor 1010 has a gate coupled to the first input 812 of the third buffer 810, a drain coupled to the supply rail, and a source coupled to the first output 816 of the third buffer 810. The first load 1020 is coupled between the first output 816 and the low rail.

The second transistor 1015 has a gate coupled to the second input 814 of the third buffer 810, a drain coupled to the supply rail, and a source coupled to the second output 818 of the third buffer 810. The second load 1025 is coupled between the second output 818 and the low rail.

In this example, each of the first transistor 820 and the second transistor 825 is configured in a source-follower configuration. Also, in this example, each of the first transistor 1010 and the second transistor 1015 is implemented with a respective NFET. However, it is to be appreciated that the present disclosure is not limited to this example.

Each of the first load 1020 and the second load 1025 may be implemented with an active load, a passive load, or a combination thereof. In the example shown in FIG. 10, the first load 1020 is implemented with a transistor 1030 (e.g., NFET) having a drain coupled to the first output 816, a gate that is biased by a bias voltage vbiasn, and a source coupled to the low rail. The second load 1030 is implemented with a transistor 1035 (e.g., NFET) having a drain coupled to the second output 818, a gate that is biased by the bias voltage vbiasn, and a source coupled to the low rail.

Although aspects of the present disclosure are discussed above using examples of two bootstrap circuits (i.e., the first bootstrap circuit 420 and the second bootstrap circuit 430) and two switch transistors (i.e., the first switch transistor 412 and the second switch transistor 414), it is to be appreciated that the present disclosure is not limited to two bootstrap circuits and two switch transistors.

Figure 11:
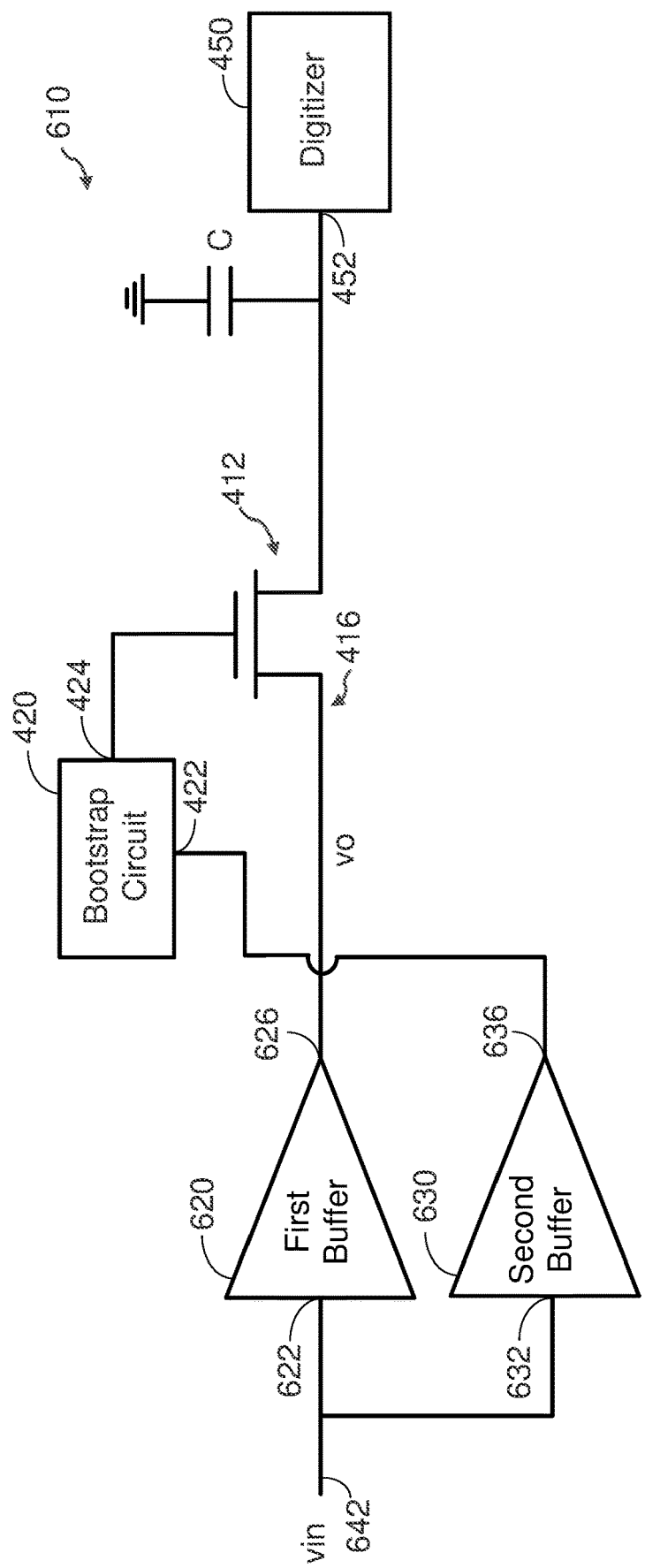
FIG. 11 shows an example of a system including a first buffer, a second buffer, a switch transistor, and a bootstrap circuit according to certain aspects of the present disclosure.

In this regard, FIG. 11 shows an example in which the second bootstrap circuit 430 and the second switch transistor 414 are omitted. In this example, the first buffer 620 drives the first signal path 416 and the second buffer 630 drives the input 422 of the first bootstrap circuit 420, as discussed above. For the example where the first buffer 620 and the second buffer 630 are implemented using the exemplary implementation shown in FIG. 7, the second transistor 715 and the second load 725 may be omitted from the first buffer 620, and the second transistor 755 and the second load 765 may be omitted from the second buffer 620. For the example where the first buffer 620 and the second buffer 630 are implemented using the exemplary implementation shown in FIG. 9, the second transistor 925 and the second load 935 may be omitted from the first buffer 620, and the second transistor 955 and the second load 965 may be omitted from the second buffer 630.

Figure 12:
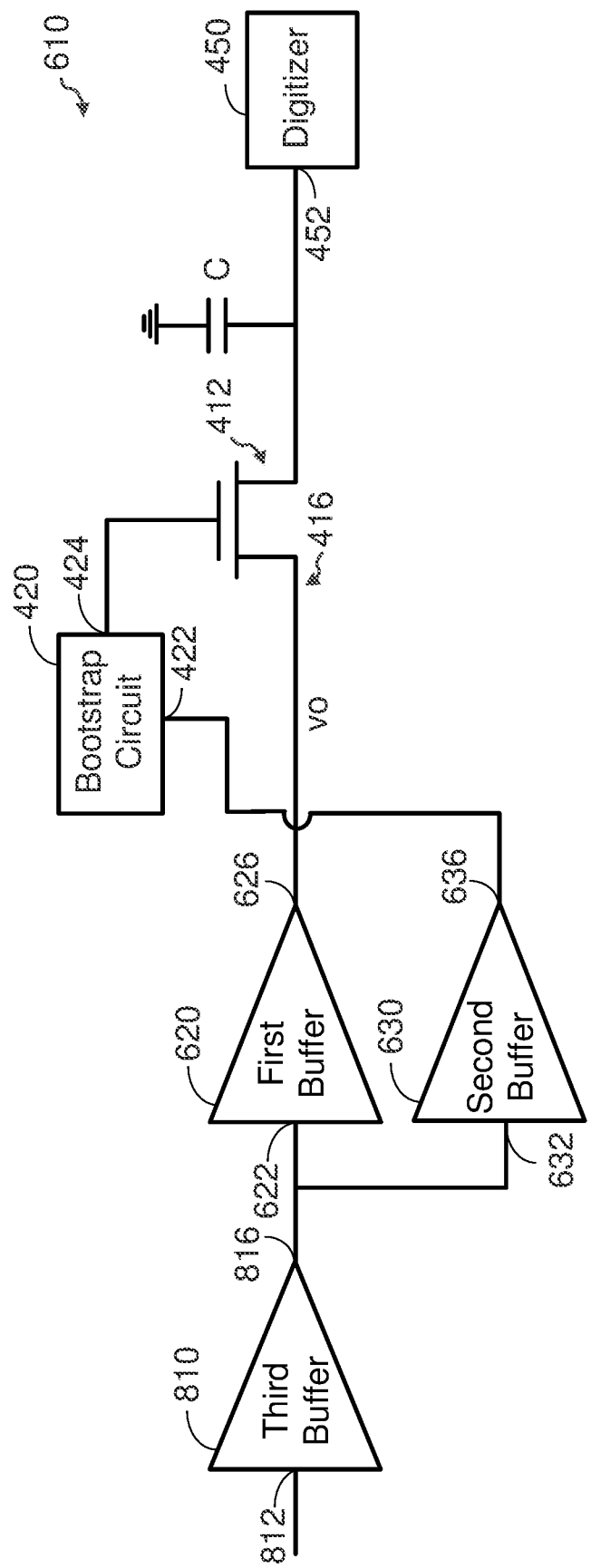
FIG. 12 shows an example of the system in FIG. 11 further including a third buffer according to certain aspects of the present disclosure.

FIG. 12 shows an example of the system 610 including the third buffer 810 coupled to the inputs 622 and 632 of the first and second buffers 620 and 630. For the example where the third buffer 810 is implemented using the exemplary implementation shown in FIG. 8, the second transistor 825 and the second load 835 may be omitted from the third buffer 810. For the example where the third buffer 810 is implemented using the exemplary implementation shown in FIG. 10, the second transistor 1015 and the second load 1025 may be omitted from the third buffer 810.

Figure 13:
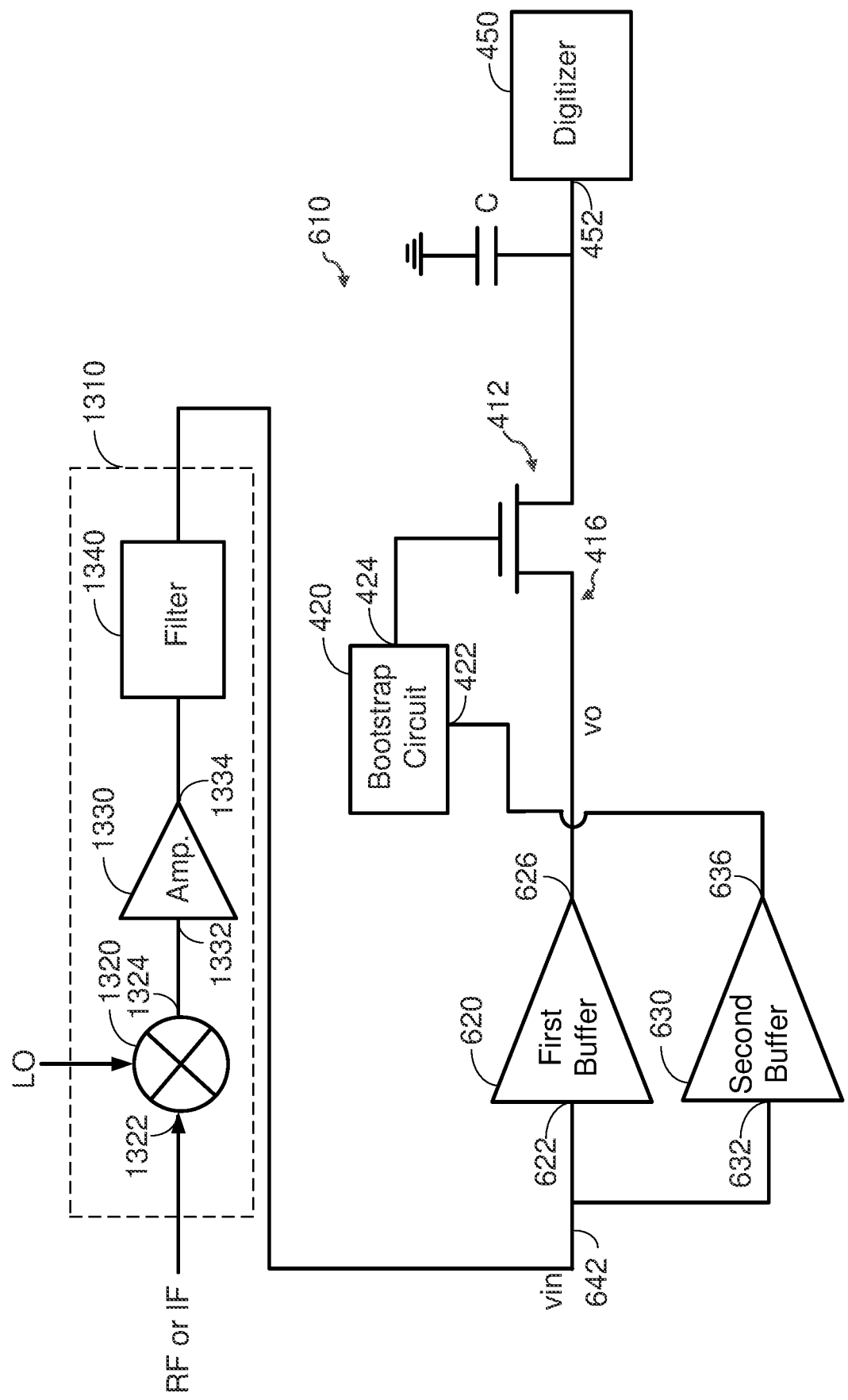
FIG. 13 shows an example of a receiver coupled to the system of FIG. 11 according to certain aspects of the present disclosure.

In certain aspects, the system 610 may be used to digitize a signal from a receiver in a wireless device. In this regard, FIG. 13 shows an example of a receiver 1310 coupled to the common input 642 of the buffers 620 and 630. In this example, the receiver 1310 includes a mixer 1320, an amplifier 1330 (e.g., a transimpedance amplifier), and a filter 1340. The mixer 1320 has an input 1322 and an output 1324. The mixer 1320 is configured to receive a radio frequency (RF) or an intermediate frequency (IF) signal at the input 1322, mix the RF signal or the IF signal with a local oscillator (LO) signal to frequency downconvert the RF signal or the IF signal into a baseband signal, and output the baseband signal at the output 1324. The RF signal may come from an antenna (not shown) and may be processed by one or more front-end components (e.g., low noise amplifier) before being input to the mixer 1320. For the example of the IF signal, the IF signal may come from a preceding mixer (not shown) that downconverts an RF signal into the IF signal.

The amplifier 1330 has an input 1332 coupled to the output 1324 of the mixer 1320, and an output 1334. The amplifier 1330 is configured to amplify the baseband signal from the mixer 1320, and output the amplified baseband signal at the output 1334. The filter 1340 is couped between the output 1334 of the amplifier 1330 and the common input 642 of the buffers 620 and 632. For example, the filter 1340 may be a low pass filter (e.g., low pass resistor-capacitor (RC) filter) configured to filter out out-of-band signals.

The first buffer 620 generates a first output signal based on the baseband signal, and the second buffer 630 generates a second output signal based on the baseband signal. The bootstrap circuit 420 may generate a boosted voltage based on the second output signal. The bootstrap circuit 420 may output the boosted voltage to the gate of the switch transistor 412 during a sampling phase to turn on the switch transistor 412, and turn off the switch transistor 412 during a hold phase. As a result, the switch transistor 412 passes the first output signal to the capacitor C during the sampling phase and blocks the first output signal during hold phase. During the hold phase, the digitizer 450 may digitize the voltage on the capacitor C into a digital signal, and output the digital signal to a baseband processor (not shown) to process the digital signal. Processing performed by the baseband processor may include demodulation, decoding, etc. The baseband processor may also be referred to as a modem or another term.

In this example, the second buffer 630 may be configured to reduce the amount of kickback caused by the bootstrap circuit 420 at the input 632 of the second buffer 630. This reduces the amount of kickback that propagates back to the receiver 1310, thereby reducing noise in the receiver 1310 caused by the kickback.

It is to be appreciated that the receiver 1310 may also be used in implementations where the system 610 includes both the first and second switch transistors 412 and 414. For example, in some implementations, the receiver 1310 may be implemented with a differential receiver that outputs a differential signal including a first voltage and a second voltage. In this example, the first voltage may be input to the first common input 642 of the buffers 620 and 630 and the second voltage may be input to the second common input 644 of the buffers 620 and 630.

Figure 14:
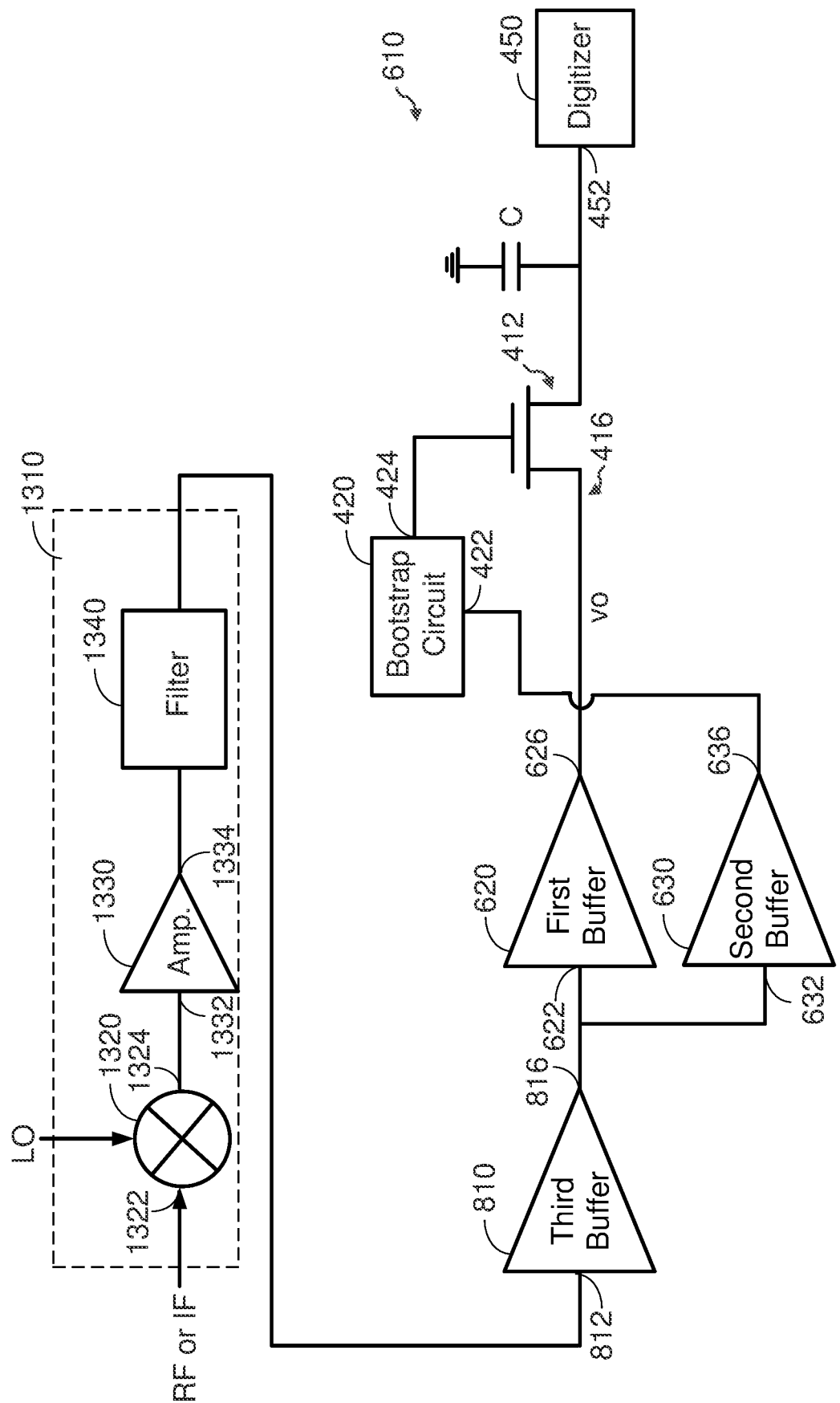
FIG. 14 shows an example of a receiver coupled to the system of FIG. 12 according to certain aspects of the present disclosure.

FIG. 14 shows an example in which the system 610 includes the third buffer 810 discussed above according to certain aspects. In this example, the filter 1340 may be coupled between the output 1334 of the amplifier 1330 and the input 812 of the third amplifier 810. The output 816 of the third buffer 810 is coupled to the input 622 of the first buffer 620 and the input 632 of the second buffer 630. For implementations where the system 620 includes both the first and second switch transistors 412 and 414, the receiver 1310 may be implemented with differential receiver that outputs a differential signal including a first voltage and a second voltage. In this example, the first voltage may be input to the first input 812 of the third buffer 810 and the second voltage may be input to the second input 814 of the third buffer 810.

Figure 15:
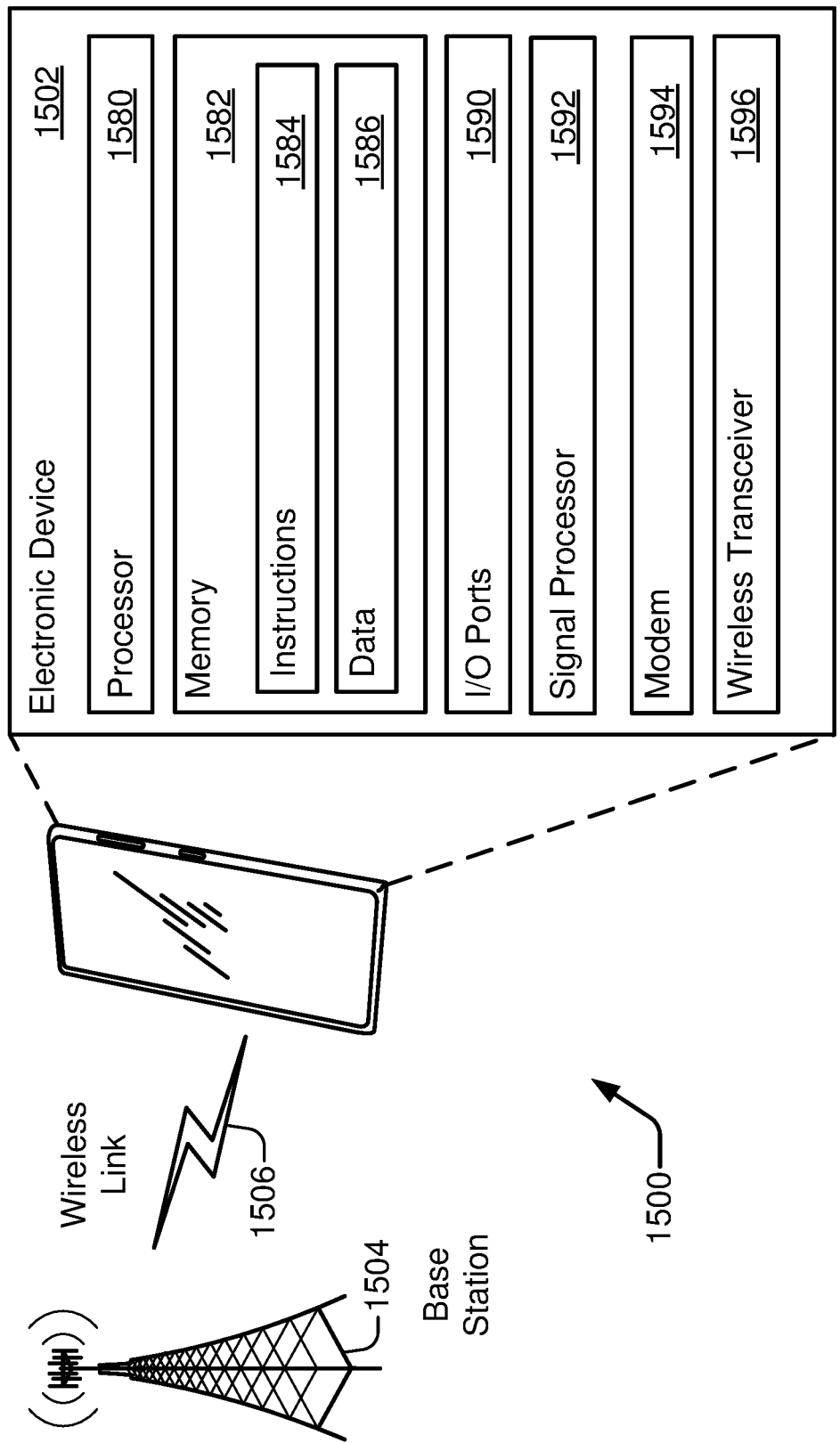
FIG. 15 is a diagram of an environment including an electronic device that includes a transceiver according to certain aspects of the present disclosure.

FIG. 15 is a diagram of an environment 1500 that includes an electronic device 1502 and a base station 1504. The electronic device 1502 includes a wireless transceiver 1596, which may include the mixer 1320, the amplifier 1330, and/or the filter 1340.

In the environment 1500, the electronic device 1502 communicates with the base station 1504 through a wireless link 1506. As shown, the electronic device 1502 is depicted as a smart phone. However, the electronic device 1502 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1504 communicates with the electronic device 1502 via the wireless link 1506, which may be implemented as any suitable type of wireless link. Although depicted as a base station tower of a cellular radio network, the base station 1504 may represent or be implemented as another device, such as a satellite, terrestrial broadcast tower, access point, peer to peer device, mesh network node, fiber optic line, another electronic device generally as described above, and so forth. Hence, the electronic device 1502 may communicate with the base station 1504 or another device via a wired connection, a wireless connection, or a combination thereof. The wireless link 1506 can include a downlink of data or control information communicated from the base station 1504 to the electronic device 1502 and an uplink of other data or control information communicated from the electronic device 1502 to the base station 1504. The wireless link 1506 may be implemented using any suitable communication protocol or standard, such as 3rd Generation Partnership Project Long-Term Evolution (3GPP LTE, 3GPP NR 5G), IEEE 1502.11, IEEE 1502.11, Bluetooth™, and so forth.

The electronic device 1502 includes a processor 1580 and a memory 1582. The memory 1582 may be or form a portion of a computer readable storage medium. The processor 1580 may include any type of processor, such as an application processor or a multi-core processor, that is configured to execute processor-executable instructions (e.g., code) stored by the memory 1582. The memory 1582 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1582 is implemented to store instructions 1584, data 1586, and other information of the electronic device 1502.

The electronic device 1102 may also include input/output (I/O) ports 1590. The I/O ports 1590 enable data exchanges or interaction with other devices, networks, or users or between components of the device.

The electronic device 1502 may further include a signal processor (SP) 1592 (e.g., such as a digital signal processor (DSP)). The signal processor 1592 may function similar to the processor 1580 and may be capable of executing instructions and/or processing information in conjunction with the memory 1582.

For communication purposes, the electronic device 1502 also includes a modem 1594, the wireless transceiver 1596, and one or more antennas. The wireless transceiver 1596 provides connectivity to respective networks and other electronic devices connected therewith using RF wireless signals. The wireless transceiver 1596 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN). In certain aspects, the electronic device 1502 may include the system 610 according to various aspects for converting signals from the wireless transceiver 1596 into digital signals, and outputting the digital signals to the modem 1594 or another processor for further processing.

Figure 16:
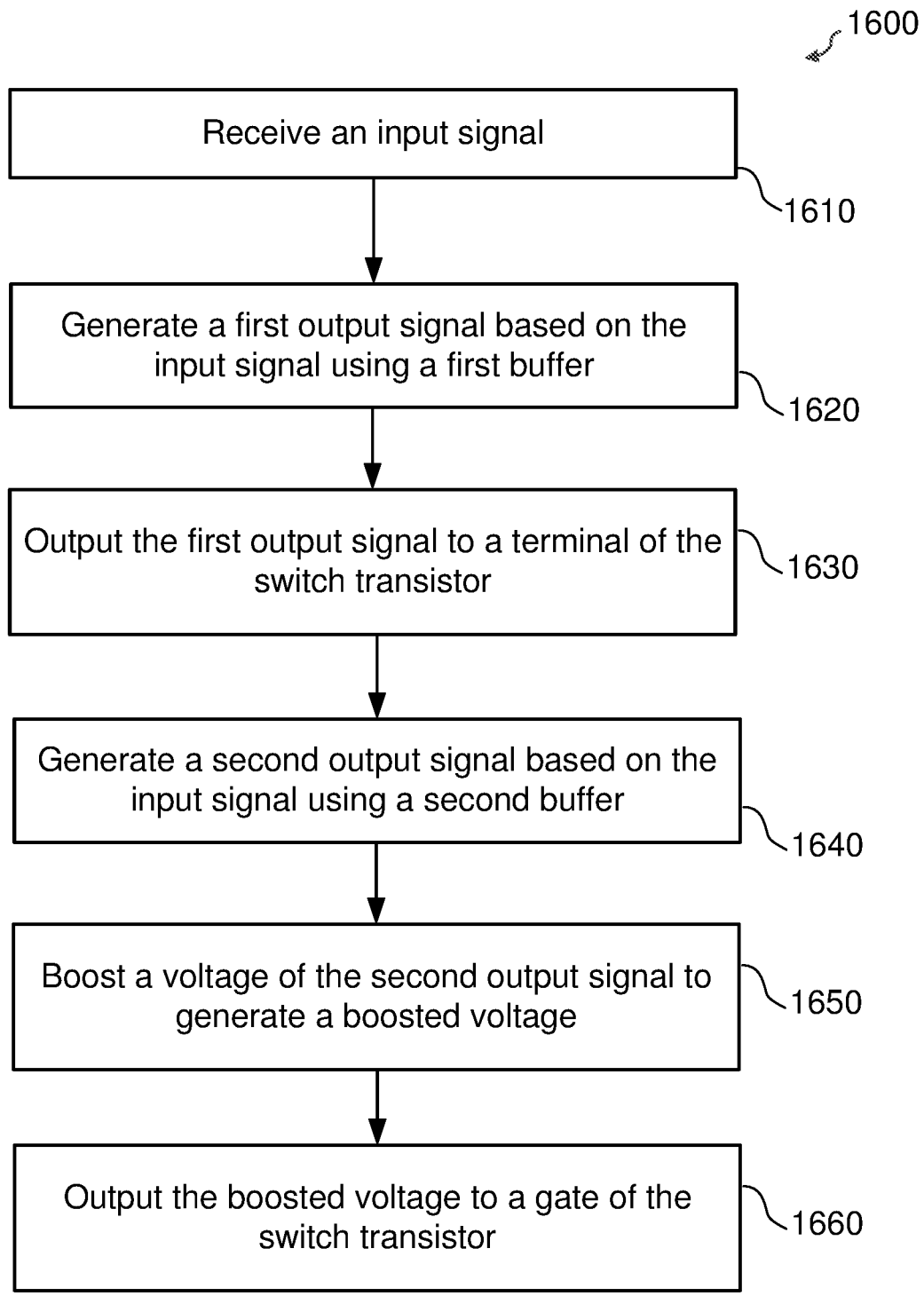
FIG. 16 is a flowchart illustrating a method for operating a switch transistor according to certain aspects of the present disclosure.

FIG. 16 illustrates a method 1600 for operating a switch transistor according to certain aspects. The switch transistor may correspond to the first switch transistor 412.

At block 1610, an input signal is received. For example, the input signal may correspond to the input voltage vin or vin1. The input signal may come from third buffer 810 or another circuit (e.g., the mixer 1320, the receiver 1310, etc.).

At block 1620, a first output signal is generated based on the input signal using a first buffer. The first buffer may correspond to the first buffer 620.

At block 1630, the first output signal is output to a terminal of the switch transistor. For example, the first output signal may be output from the first output 626 of the first buffer 620. The first output signal may correspond to the output voltage vo or vo1. In certain aspects, the switch transistor (e.g., switch transistor 412) is in a signal path (e.g., signal path 416) in which the switch transistor is used to block or pass the first output signal.

At block 1640, a second output signal is generated based on the input signal using a second buffer. For example, the second buffer may correspond to the second buffer 630.

At block 1650, a voltage of the second output signal is boosted to generate a boosted voltage. For example, the bootstrap circuit 420 may boost the voltage of the second output signal by the boost voltage Vb to generate the boosted voltage. In certain aspects, the boost voltage Vb is equal to the supply voltage Vdd.

At block 1660, the boosted voltage is output to a gate of the switch transistor. For example, the bootstrap circuit 420 may output the boosted voltage to the gate of the switch transistor 412 via the output 424.

In certain aspects, generating the first output signal includes inputting the input signal to a gate of a first transistor, and obtaining the first output signal at a source of the first transistor. For example, the first transistor may correspond to the first transistor 710 or 920 of the first buffer 620.

In certain aspects, generating the second output signal includes inputting the input signal to a gate of a second transistor, and obtaining the second output signal at a source of the second transistor. For example, the second transistor may correspond to the first transistor 750 or 950 of the second buffer 630.

In certain aspects, a size gate area of the first transistor is larger than a gate area of the second transistor. For example, the gate area of the first transistor may be at least twice as large as the gate area of the second transistor. In another example, a gate length of the first transistor is at least twice as large (i.e., long) as a gate length of the second transistor.

It is to be appreciated that the present disclosure is not limited to the terminology used above to describe aspects of the present disclosure. For example, a buffer may also be referred to as a driver, an amplifier, or another term. A switch transistor may also be referred to as a switch, a transistor, a bootstrapped switch, a sampling switch (e.g., in the context of analog-to-digital conversion), or another term. A bootstrap circuit may also be referred to as a bootstrap switch, a boost circuit, or another term. In general, a bootstrap circuit covers any circuit configured to drive the gate of a switch transistor with a boosted voltage that tracks the voltage (e.g., vs, vo1, or vo2) on a signal path (e.g., voltage at the source of the switch transistor). A digitizer may also be referred to as an analog-to-digital converter, or another term.

It is to be appreciated that a transistor may be physically implemented on a chip using two or more transistors arranged in parallel in which the gates of the two or more transistors are coupled to together. In this example, the gate area of the transistor implemented with the two or more transistors may be equal to the sum of the gate areas of the two or more transistors. In this example, the two or more transistors may have the same gate length in which the gate length of the transistor implemented with the two or more transistors is equal to the gate length of each of the two or more transistors, and the gate width of the transistor implemented with the two or more transistors is the sum of the gate widths of the two or more transistors.

Implementation examples are described in the following numbered clauses:

1. A system, comprising:
   a switch transistor;
   a bootstrap circuit having an input and an output, wherein the output of the bootstrap circuit is coupled to a gate of the switch transistor;
   a first buffer having an input and an output, wherein the output of the first buffer is coupled to a terminal of the switch transistor;
   a second buffer having an input and an output, wherein the input of the second buffer is coupled to the input of the first buffer, and the output of the second buffer is coupled to the input of the bootstrap circuit.

2. The system of clause 1, wherein the bootstrap circuit is configured to:
   boost a voltage at the input of the bootstrap circuit to generate a boosted voltage; and
   output the boosted voltage at the output of the bootstrap circuit.

3. The system of clause 1 or 2, wherein the first buffer comprises:
   a first transistor having a gate, a source, and a drain, wherein the gate of the first transistor is coupled to the input of the first buffer, the drain of the first transistor is coupled to a first rail, and the source of the first transistor is coupled to the output of the first buffer; and a first load coupled between the output of the first buffer and a second rail.

4. The system of clause 3, wherein the second buffer comprises:

a second transistor having a gate, a source, and a drain, wherein the gate of the second transistor is coupled to the input of the second buffer, the drain of the second transistor is coupled to the first rail, and the source of the second transistor is coupled to the output of the second buffer; and a second load coupled between the output of the second buffer and the second rail.

5. The system of clause 4, wherein a gate area of the first transistor is larger than a gate area of the second transistor.

6. The system of clause 5, wherein the gate area of the first transistor is at least twice as large as the gate area of the second transistor.

7. The system of any one of clauses 4 to 6, wherein the first transistor comprises a first n-type field effect transistor (NFET), the second transistor comprises a second NFET, the first rail is a supply rail, and the second rail is a low rail having a lower potential than the supply rail.

8. The system of any one of clauses 4 to 6, wherein the first transistor comprises a first p-type field effect transistor (PFET), the second transistor comprises a second PFET, the second rail is a supply rail, and the first rail is a low rail having a lower potential than the supply rail.

9. The system of any one of clauses 4 to 8, further comprising a third buffer having an input and an output, wherein the output of the third buffer is coupled to the input of the first buffer and the input of the second buffer, and the third buffer comprises:

a third transistor having a gate, a source, and a drain, wherein the gate of the third transistor is coupled to the input of the third buffer, the drain of the third transistor is coupled to the second rail, and the source of the third transistor is coupled to the output of the third buffer; and a third load coupled between the output of the third buffer and the first rail.

10. The system of any one of clauses 1 to 9, further comprising a capacitor, wherein the switch transistor is coupled between the output of the first buffer and the capacitor.

11. The system of clause 10, further comprising a digitizer coupled to the capacitor.

12. The system of any one of clauses 1 to 11, wherein the bootstrap circuit comprises:

a capacitor;

a first switch coupled between a first terminal of the capacitor and a boost voltage;

a second switch coupled between a second terminal of the capacitor and a ground;

a third switch coupled between the first terminal of the capacitor and the output of the bootstrap circuit; and a fourth switch coupled between the second terminal of the capacitor and the input of the bootstrap circuit.

13. The system of clause 12, wherein the bootstrap circuit comprises a switch control circuit configured to:

receive a clock signal;

during a first phase of a cycle of the clock signal, turn on the first switch, turn on the second switch, turn off the third switch, and turn off the fourth switch; and during a second phase of the cycle of the clock signal, turn off the first switch, turn off the second switch, turn on the third switch, and turn on the fourth switch.

14. The system of clause 13, wherein the bootstrap circuit further comprises a fifth switch coupled between the output of the bootstrap circuit and the ground, and the switch control circuit is configured to turn on the fifth switch during the first phase of the cycle of the clock signal, and turn off the fifth switch during the second phase of the cycle of the clock signal.

15. The system of any one of clauses 12 to 14, wherein the boost voltage comprises a supply voltage on a supply rail, and the first switch is coupled between the supply rail and the first terminal of the capacitor.

16. The system of any one of clauses 1 to 15, wherein the switch transistor comprises an n-type field effect transistor (NFET).

17. The system of any one of clauses 1 to 16, further comprising a third buffer having an input and an output, wherein the output of the third buffer is coupled to the input of the first buffer and the input of the second buffer.

18. A system, comprising:

a first switch transistor;

a second switch transistor;

a first bootstrap circuit having an input and an output, wherein the output of the first bootstrap circuit is coupled to a gate of the first switch transistor;

a second bootstrap circuit having an input and an output, wherein the output of the second bootstrap circuit is coupled to a gate of the second switch transistor;

a first buffer having a first input, a second input, a first output, and a second output, wherein the first output of the first buffer is coupled to a terminal of the first switch transistor, and the second output of the first buffer is coupled to a terminal of the second switch transistor; and a second buffer having a first input, a second input, a first output, and a second output, wherein the first input of the second buffer is coupled to the first input of the first buffer, the second input of the second buffer is coupled to the second input of the first buffer, the first output of the first buffer is coupled to the input of the first bootstrap circuit, and the second output of the first buffer is coupled to the input of the second bootstrap circuit.

19. The system of clause 18, wherein the first bootstrap circuit is configured to:

boost a voltage at the input of the first bootstrap circuit to generate a first boosted voltage, and output the first boosted voltage at the output of the first bootstrap circuit.

20. The system of clause 19, wherein the second bootstrap circuit is configured to:

boost a voltage at the input of the second bootstrap circuit to generate a second boosted voltage, and output the second boosted voltage at the output of the second bootstrap circuit.

21. The system of any one of clauses 18 to 20, wherein the first buffer comprises:

a first transistor having a gate, a source, and a drain, wherein the gate of the first transistor is coupled to the first input of the first buffer, the drain of the first transistor is coupled to a first rail, and the source of the first transistor is coupled to the first output of the first buffer;
a second transistor having a gate, a source, and a drain, wherein the gate of the second transistor is coupled to the second input of the first buffer, the drain of the second transistor is coupled to the first rail, and the source of the second transistor is coupled to the second output of the first buffer;
a first load coupled between the first output of the first buffer and a second rail; and
a second load coupled between the second output of the first buffer and the second rail.

22. The system of clause 21, wherein the second buffer comprises:
a third transistor having a gate, a source, and a drain, wherein the gate of the third transistor is coupled to the first input of the second buffer, the drain of the third transistor is coupled to the first rail, and the source of the third transistor is coupled to the first output of the second buffer;
a fourth transistor having a gate, a source, and a drain, wherein the gate of the fourth transistor is coupled to the second input of the second buffer, the drain of the fourth transistor is coupled to the first rail, and the source of the fourth transistor is coupled to the second output of the second buffer;
a third load coupled between the first output of the second buffer and the second rail; and
a fourth load coupled between the second output of the second buffer and the second rail.

23. The system of clause 22, wherein a gate area of the first transistor is larger than a gate area of the third transistor.

24. The system of clause 23, wherein the gate area of the first transistor is at least twice the gate area of the third transistor.

25. The system of any one of clauses 22 to 24, wherein the first rail is a supply rail, and the second rail is a low rail having a lower potential than the supply rail.

26. The system of any one of clauses 22 to 24, wherein the second rail is a supply rail, and the first rail is a low rail having a lower potential than the supply rail.

27. The system of any one of clauses 18 to 26, further comprising:
a first capacitor, wherein the first switch transistor is coupled between the first output of the first buffer and the first capacitor; and
a second capacitor, wherein the second switch transistor is coupled between the second output of the first buffer and the second capacitor.

28. The system of clause 27, further comprising a digitizer coupled to the first capacitor and the second capacitor.

29. The system of any one of clauses 18 to 28, further comprising a third buffer having a first input, a second input, a first output, and a second output, wherein the first output of the third buffer is coupled to the first input of the first buffer and the first input of the second buffer, and the second output of the third buffer is coupled to the second input of first buffer and the second input of the second buffer.

30. A method for operating a switch transistor, the method comprising:
receiving an input signal;
generating a first output signal based on the input signal using a first buffer;
outputting the first output signal to a terminal of the switch transistor;
generating a second output signal based on the input signal using a second buffer;
boosting a voltage of the second output signal to generate a boosted voltage; and
outputting the boosted voltage to a gate of the switch transistor.

31. The method of clause 30, wherein generating the first output signal comprises:
inputting the input signal to a gate of a first transistor; and
obtaining the first output signal at a source of the first transistor.

32. The method of clause 31, wherein generating the second output signal comprises:
inputting the input signal to a gate of a second transistor; and
obtaining the second output signal at a source of the second transistor.

33. The method of clause 32, wherein a gate area of the first transistor is larger than a gate area of the second transistor.

34. The method of clause 33, wherein the gate area of the first transistor is at least twice as larger as the gate area of the second transistor.

35. A system, comprising:
a switch transistor;
means for buffering an input signal to obtain a first output signal and providing the first output signal to a terminal of the switch transistor;
means for buffering the input signal to obtain a second output signal; and
means for boosting a voltage of the second output signal to obtain a boosted voltage and providing the boosted voltage at a gate of the switch transistor.

Within the present disclosure, the word "exemplary" is used to mean "serving" as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:
1. A system, comprising:
a switch transistor;

a bootstrap circuit having an input and an output, wherein the output of the bootstrap circuit is coupled to a gate of the switch transistor;
a first buffer having an input and an output, wherein the output of the first buffer is coupled to a terminal of the switch transistor, the first buffer comprising:
  a first transistor having a gate, a source, and a drain, wherein the gate of the first transistor is coupled to the input of the first buffer, the drain of the first transistor is coupled to a first rail, and the source of the first transistor is coupled to the output of the first buffer; and
  a first load coupled between the output of the first buffer and a second rail; and
a second buffer having an input and an output, wherein the input of the second buffer is coupled to the input of the first buffer, and the output of the second buffer is coupled to the input of the bootstrap circuit.

2. The system of claim 1, wherein the bootstrap circuit is configured to:
  boost a voltage at the input of the bootstrap circuit to generate a boosted voltage; and
  output the boosted voltage at the output of the bootstrap circuit.

3. The system of claim 1, wherein the second buffer comprises:
  a second transistor having a gate, a source, and a drain, wherein the gate of the second transistor is coupled to the input of the second buffer, the drain of the second transistor is coupled to the first rail, and the source of the second transistor is coupled to the output of the second buffer; and
  a second load coupled between the output of the second buffer and the second rail.

4. The system of claim 3, wherein a gate area of the first transistor is larger than a gate area of the second transistor.

5. The system of claim 3, wherein the first transistor comprises a first n-type field effect transistor (NFET), the second transistor comprises a second NFET, the first rail is a supply rail, and the second rail is a low rail having a lower potential than the supply rail.

6. The system of claim 3, wherein the first transistor comprises a first p-type field effect transistor (PFET), the second transistor comprises a second PFET, the second rail is a supply rail, and the first rail is a low rail having a lower potential than the supply rail.

7. The system of claim 3, further comprising a third buffer having an input and an output, wherein the output of the third buffer is coupled to the input of the first buffer and the input of the second buffer, and the third buffer comprises:
  a third transistor having a gate, a source, and a drain, wherein the gate of the third transistor is coupled to the input of the third buffer, the drain of the third transistor is coupled to the second rail, and the source of the third transistor is coupled to the output of the third buffer; and
  a third load coupled between the output of the third buffer and the first rail.

8. The system of claim 1, further comprising a capacitor, wherein the switch transistor is coupled between the output of the first buffer and the capacitor.

9. The system of claim 8, further comprising a digitizer coupled to the capacitor.

10. The system of claim 1, wherein the bootstrap circuit comprises:
  a capacitor;
  a first switch coupled between a first terminal of the capacitor and a boost voltage;
  a second switch coupled between a second terminal of the capacitor and a ground;
  a third switch coupled between the first terminal of the capacitor and the output of the bootstrap circuit; and
  a fourth switch coupled between the second terminal of the capacitor and the input of the bootstrap circuit.

11. The system of claim 10, wherein the bootstrap circuit comprises a switch control circuit configured to:
  receive a clock signal;
  during a first phase of a cycle of the clock signal, turn on the first switch, turn on the second switch, turn off the third switch, and turn off the fourth switch; and
  during a second phase of the cycle of the clock signal, turn off the first switch, turn off the second switch, turn on the third switch, and turn on the fourth switch.

12. The system of claim 11, wherein the bootstrap circuit further comprises a fifth switch coupled between the output of the bootstrap circuit and the ground, and the switch control circuit is configured to turn on the fifth switch during the first phase of the cycle of the clock signal, and turn off the fifth switch during the second phase of the cycle of the clock signal.

13. The system of claim 1, further comprising a third buffer having an input and an output, wherein the output of the third buffer is coupled to the input of the first buffer and the input of the second buffer.

14. A system, comprising:
  a first switch transistor;
  a second switch transistor;
  a first bootstrap circuit having an input and an output, wherein the output of the first bootstrap circuit is coupled to a gate of the first switch transistor;
  a second bootstrap circuit having an input and an output, wherein the output of the second bootstrap circuit is coupled to a gate of the second switch transistor;
  a first buffer having a first input, a second input, a first output, and a second output, wherein the first output of the first buffer is coupled to a terminal of the first switch transistor, and the second output of the first buffer is coupled to a terminal of the second switch transistor; and
  a second buffer having a first input, a second input, a first output, and a second output, wherein the first input of the second buffer is coupled to the first input of the first buffer, the second input of the second buffer is coupled to the second input of the first buffer, the first output of the first buffer is coupled to the input of the first bootstrap circuit, and the second output of the first buffer is coupled to the input of the second bootstrap circuit.

15. The system of claim 14, wherein the first bootstrap circuit is configured to:
  boost a voltage at the input of the first bootstrap circuit to generate a first boosted voltage, and
  output the first boosted voltage at the output of the first bootstrap circuit.

16. The system of claim 15, wherein the second bootstrap circuit is configured to:
  boost a voltage at the input of the second bootstrap circuit to generate a second boosted voltage, and
  output the second boosted voltage at the output of the second bootstrap circuit.

17. The system of claim 14, wherein the first buffer comprises:

a first transistor having a gate, a source, and a drain, wherein the gate of the first transistor is coupled to the first input of the first buffer, the drain of the first transistor is coupled to a first rail, and the source of the first transistor is coupled to the first output of the first buffer;

a second transistor having a gate, a source, and a drain, wherein the gate of the second transistor is coupled to the second input of the first buffer, the drain of the second transistor is coupled to the first rail, and the source of the second transistor is coupled to the second output of the first buffer;

a first load coupled between the first output of the first buffer and a second rail; and a second load coupled between the second output of the first buffer and the second rail.

18. The system of claim 17, wherein the second buffer comprises:

a third transistor having a gate, a source, and a drain, wherein the gate of the third transistor is coupled to the first input of the second buffer, the drain of the third transistor is coupled to the first rail, and the source of the third transistor is coupled to the first output of the second buffer;

a fourth transistor having a gate, a source, and a drain, wherein the gate of the fourth transistor is coupled to the second input of the second buffer, the drain of the fourth transistor is coupled to the first rail, and the source of the fourth transistor is coupled to the second output of the second buffer;

a third load coupled between the first output of the second buffer and the second rail; and a fourth load coupled between the second output of the second buffer and the second rail.

19. The system of claim 18, wherein a gate area of the first transistor is larger than a gate area of the third transistor.

20. The system of claim 18, wherein the first rail is a supply rail, and the second rail is a low rail having a lower potential than the supply rail.

21. The system of claim 18, wherein the second rail is a supply rail, and the first rail is a low rail having a lower potential than the supply rail.

22. The system of claim 14, further comprising:

a first capacitor, wherein the first switch transistor is coupled between the first output of the first buffer and the first capacitor; and a second capacitor, wherein the second switch transistor is coupled between the second output of the first buffer and the second capacitor.

23. The system of claim 22, further comprising a digitizer coupled to the first capacitor and the second capacitor.

24. The system of claim 14, further comprising a third buffer having a first input, a second input, a first output, and a second output, wherein the first output of the third buffer is coupled to the first input of the first buffer and the first input of the second buffer, and the second output of the third buffer is coupled to the second input of first buffer and the second input of the second buffer.

25. A system, comprising:

a switch transistor;

a bootstrap circuit having an input and an output, wherein the output of the bootstrap circuit is coupled to a gate of the switch transistor;

a first buffer having an input and an output, wherein the output of the first buffer is coupled to a terminal of the switch transistor;

a second buffer having an input and an output, wherein the input of the second buffer is coupled to the input of the first buffer, and the output of the second buffer is coupled to the input of the bootstrap circuit; and a third buffer having an input and an output, wherein the output of the third buffer is coupled to the input of the first buffer and the input of the second buffer.

26. The system of claim 25, wherein the first buffer comprises:

a first transistor having a gate, a source, and a drain, wherein the gate of the first transistor is coupled to the input of the first buffer, the drain of the first transistor is coupled to a first rail, and the source of the first transistor is coupled to the output of the first buffer.

27. The system of claim 26, wherein the second buffer comprises:

a second transistor having a gate, a source, and a drain, wherein the gate of the second transistor is coupled to the input of the second buffer, the drain of the second transistor is coupled to the first rail, and the source of the second transistor is coupled to the output of the second buffer.

28. The system of claim 27, wherein a gate area of the first transistor is larger than a gate area of the second transistor.

29. A system, comprising:

a switch transistor;

a bootstrap circuit having an input and an output, wherein the output of the bootstrap circuit is coupled to a gate of the switch transistor;

a first buffer having an input and an output, wherein the output of the first buffer is coupled to a terminal of the switch transistor, the first buffer comprising a first transistor;

a second buffer having an input and an output, wherein the input of the second buffer is coupled to the input of the first buffer, and the output of the second buffer is coupled to the input of the bootstrap circuit, the second buffer comprising a second transistor, wherein a gate area of the first transistor is larger than a gate area of the second transistor.

* * * * *